US012658244B2

(12) United States Patent
Kwon et al.

(10) Patent No.: US 12,658,244 B2
(45) Date of Patent: Jun. 16, 2026

(54) MEMORY DEVICE WITH VERTICAL WIRING BETWEEN SEMICONDUCTOR LAYERS AND MEMORY SYSTEM INCLUDING THE SAME

(71) Applicant: SAMSUNG ELECTRONICS CO., LTD., Suwon-si (KR)

(72) Inventors: Daehyeon Kwon, Suwon-si (KR); Donggeon Kim, Suwon-si (KR); Bokyeon Won, Suwon-si (KR); Selyung Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 140 days.

(21) Appl. No.: 18/618,567

(22) Filed: Mar. 27, 2024

(65) Prior Publication Data

US 2025/0124974 A1      Apr. 17, 2025

(30) Foreign Application Priority Data

Oct. 13, 2023    (KR) ......................... 10-2023-0136630

(51) Int. Cl.
| | |
|---|---|
| *G11C 11/4097* | (2006.01) |
| *G11C 5/06* | (2006.01) |
| *G11C 11/4091* | (2006.01) |

(52) U.S. Cl.
CPC .......... *G11C 11/4097* (2013.01); *G11C 5/063* (2013.01); *G11C 11/4091* (2013.01)

(58) Field of Classification Search
CPC ................................................ G11C 11/4097
See application file for complete search history.

(56) References Cited

U.S. PATENT DOCUMENTS

| | | | |
|---|---|---|---|
| 7,660,141 B2 | 2/2010 | Chang | |
| 7,855,926 B2 * | 12/2010 | Shin .................... | G11C 11/4091 |
| | | | 365/207 |
| 10,224,093 B2 | 3/2019 | Kim et al. | |
| 10,541,022 B2 | 1/2020 | Kim et al. | |
| 10,692,565 B2 | 6/2020 | Kim et al. | |
| 10,755,765 B2 | 8/2020 | Won et al. | |
| 10,803,925 B2 | 10/2020 | Kim et al. | |

(Continued)

FOREIGN PATENT DOCUMENTS

| | | |
|---|---|---|
| JP | 2020-48179 A | 3/2020 |
| KR | 10-2018-0076842 A | 7/2018 |
| KR | 10-2381341 B1 | 3/2022 |

*Primary Examiner* — Hoai V Ho
(74) *Attorney, Agent, or Firm* — Sughrue Mion, PLLC

(57) ABSTRACT

A memory device includes a first semiconductor layer and a second semiconductor layer disposed with respect to the first semiconductor layer in a third direction. The first semiconductor layer includes a memory cell array, a bitline and a complementary bitline coupled with the memory cell array, a first vertical wire coupled with the bitline, and a second vertical wire coupled with the complementary bitline. The second semiconductor layer includes a peripheral circuit, a bitline sense amplifier, first and second control lines coupled with the bitline sense amplifier, a third vertical wire coupled with the bitline sense amplifier, and a fourth vertical wire coupled with the bitline sense amplifier. The bitline sense amplifier includes at least one first transistor pair that is shared by at least one of the first and second control lines.

17 Claims, 19 Drawing Sheets

(56)            References Cited

U.S. PATENT DOCUMENTS

| | | | |
|---|---|---|---|
| 10,867,641 B2 | 12/2020 | Nakatsuka et al. | |
| 11,043,257 B2 | 6/2021 | Kim et al. | |
| 11,574,663 B2 | 2/2023 | Nakatsuka et al. | |
| 11,710,518 B2 | 7/2023 | Kim et al. | |
| 2007/0223264 A1* | 9/2007 | Bains | G11C 8/12 |
| | | | 365/63 |
| 2024/0138156 A1* | 4/2024 | Chia | H10B 80/00 |

* cited by examiner

F I G.  1
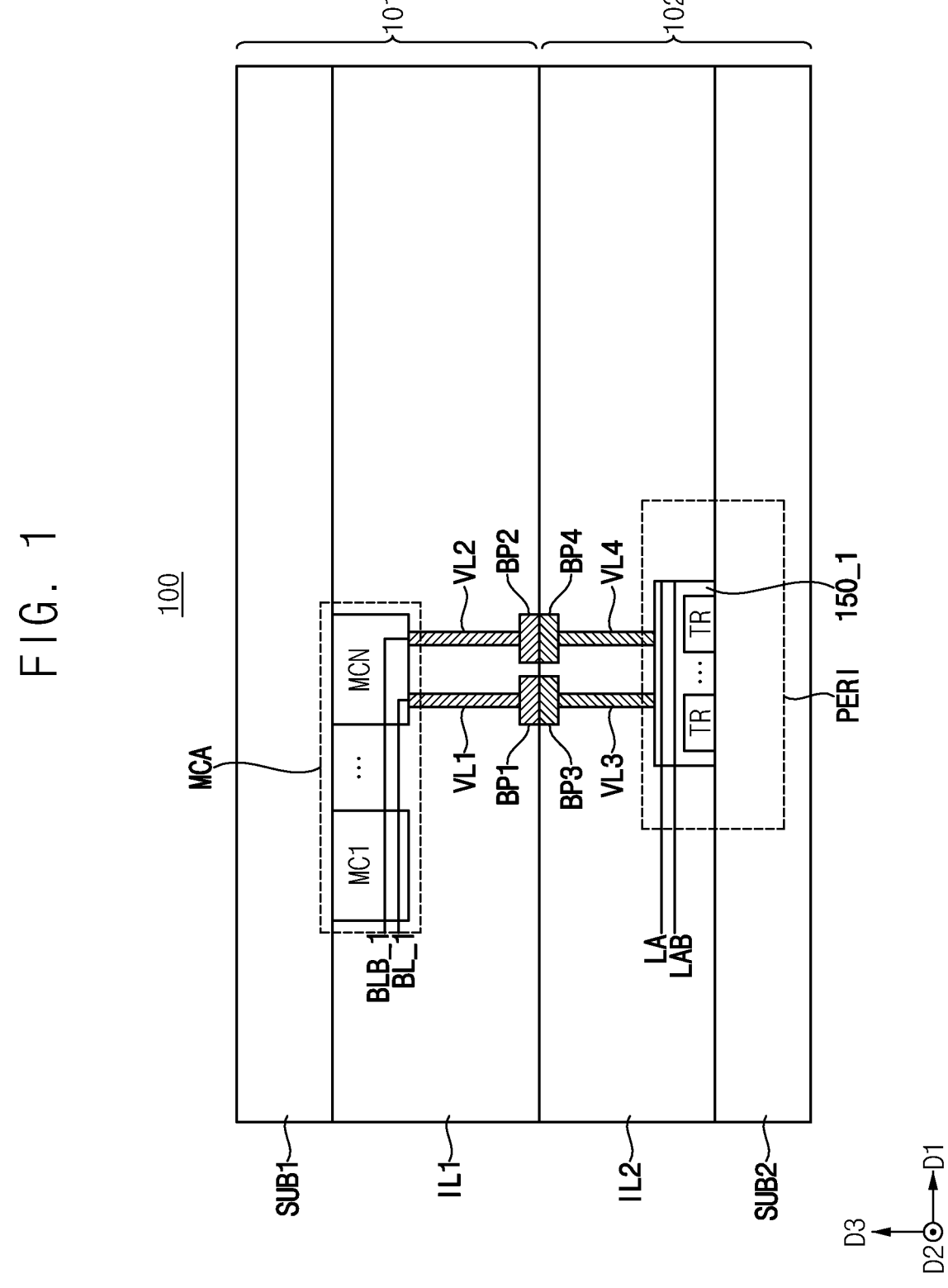

100a

BL_1   BLB_1

WL

101a

VL1

VL2

BP1   BP2

BP3   BP4

VL3

VL4

LA

LAB

P1_a   P1_b

N1_a   N1_b

102a

150_1a

100b

100c

100d

PRECHARGING OPERATION

CHARGE SHARING OPERATION

PRE-SENSING OPERATION

Figure 13:
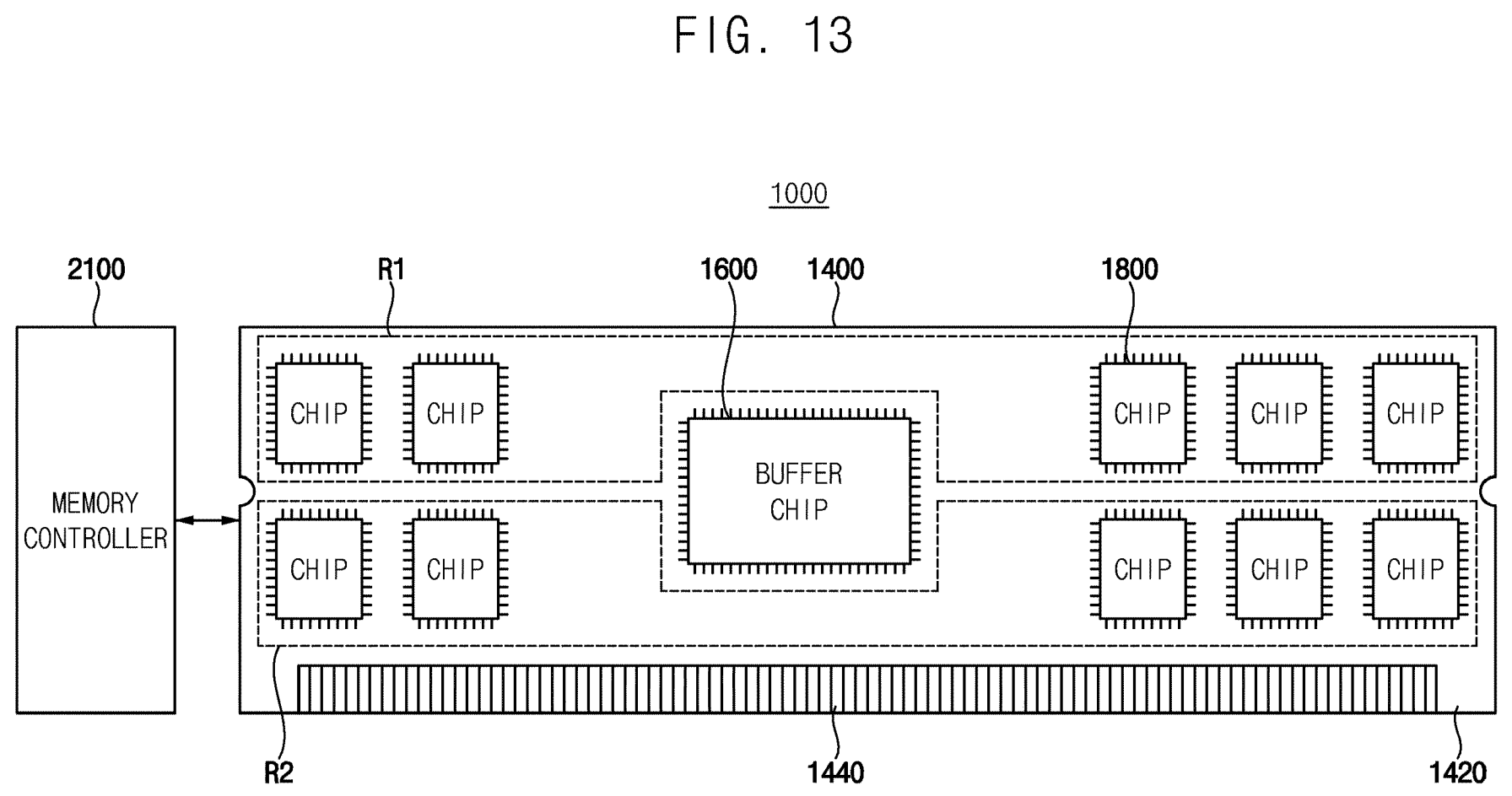

CHIP

CHIP

CHIP

CHIP

CHIP

CHIP

CHIP

CHIP

BUFFER CHIP

CHIP

CHIP

CHIP

CHIP

MEMORY CONTROLLER

MEMORY DEVICE WITH VERTICAL WIRING BETWEEN SEMICONDUCTOR LAYERS AND MEMORY SYSTEM INCLUDING THE SAME

CROSS-REFERENCE TO RELATED APPLICATIONS

This application claims benefit of priority under 35 U.S.C. § 119 to Korean Patent Application No. 10-2023-0136630, filed on Oct. 13, 2023, in the Korean Intellectual Property Office, the disclosure of which is incorporated by reference in its entirety.

BACKGROUND

1. Field

The present disclosure relates generally to memory devices, and more particularly, to memory devices and memory systems including the memory devices.

2. Description of Related Art

Examples of dynamic random access memory (DRAM) devices may include, but not be limited to, memory devices that may operate by recording data using charges that may be stored in a cell capacitor of a memory cell. Memory cells may be connected to bitlines and/or to complementary bitlines. In a related DRAM device, a bitline sense amplifier may amplify a voltage difference between the bitline and the complementary bitline when performing an operation such as, but not limited to, read operations, refresh operations, and the like. However, noise may occur during sensing and/or amplification operations of the bitline sense amplifier. The noise may be caused, for example, by limitations in semiconductor fabrication process technologies. Consequently, a sensing margin of the bitline sense amplifier may be reduced, and/or the overall performance of the memory device (e.g., the DRAM device) may be degraded. Thus, there exists a need for further improvements in memory devices, as the need for data integrity may be constrained by signal noise of bitline sense amplifiers. Improvements are presented herein. These improvements may also be applicable to other semiconductor technologies and the standards that employ these technologies.

SUMMARY

One or more example embodiments of the present disclosure provide a memory device that may potentially improve operational stability.

Further, one or more example embodiments of the present disclosure provide a memory system including the memory device.

According to an aspect of the present disclosure, a memory device includes a first semiconductor layer and a second semiconductor layer. The first semiconductor layer includes a memory cell array, a first bitline and a first complementary bitline extending in a first direction, disposed along a second direction crossing the first direction, and coupled with the memory cell array, a first vertical wire and a first bonding pad coupled with the first bitline, and a second vertical wire and a second bonding pad coupled with the first complementary bitline. The second semiconductor layer is disposed with respect to the first semiconductor layer in a third direction perpendicular to the first direction and the second direction. The second semiconductor layer includes a peripheral circuit configured to control the memory cell array, a first bitline sense amplifier configured to control the first bitline and the first complementary bitline, a first control line and a second control line coupled with the first bitline sense amplifier, a third bonding pad and a third vertical wire coupled with the first bonding pad and the first bitline sense amplifier, and a fourth bonding pad and a fourth vertical wire coupled with the second bonding pad and the first bitline sense amplifier. The first bitline sense amplifier includes at least one first transistor pair that is shared by at least one of the first control line and the second control line.

According to an aspect of the present disclosure, a memory system includes a memory device, and a memory controller configured to control operations of the memory device. The memory device includes a first semiconductor layer and a second semiconductor layer. The first semiconductor layer includes a memory cell array, a first bitline and a first complementary bitline extending in a first direction, disposed along a second direction crossing the first direction, and coupled with the memory cell array, a first vertical wire and a first bonding pad coupled with the first bitline, and a second vertical wire and a second bonding pad coupled with the first complementary bitline. The second semiconductor layer is disposed with respect to the first semiconductor layer in a third direction perpendicular to the first direction and the second direction. The second semiconductor layer includes a peripheral circuit configured to control the memory cell array, a first bitline sense amplifier configured to control the first bitline and the first complementary bitline, a first control line and a second control line coupled with the first bitline sense amplifier, a third bonding pad and a third vertical wire coupled with the first bonding pad and the first bitline sense amplifier, and a fourth bonding pad and a fourth vertical wire coupled with the second bonding pad and the first bitline sense amplifier. The first bitline sense amplifier includes at least one first transistor pair that is shared by at least one of the first control line and the second control line.

According to an aspect of the present disclosure, a memory device includes a first semiconductor layer and a second semiconductor layer. The first semiconductor layer includes a memory cell array, a first bitline and a first complementary bitline extending in a first direction, disposed along a second direction crossing the first direction, and coupled with the memory cell array, a first vertical wire and a first bonding pad coupled with the first bitline, and a second vertical wire and a second bonding pad coupled with the first complementary bitline. The second semiconductor layer is disposed with respect to the first semiconductor layer in a third direction perpendicular to the first direction and the second direction. The second semiconductor layer includes a peripheral circuit configured to control the memory cell array, a first bitline sense amplifier configured to control the first bitline and the first complementary bitline, a first control line and a second control line coupled with the first bitline sense amplifier, a third bonding pad and a third vertical wire coupled with the first bonding pad and the first bitline sense amplifier, and a fourth bonding pad and a fourth vertical wire coupled with the second bonding pad and the first bitline sense amplifier. The first bitline sense amplifier includes a first pair of P-channel transistors, a first pair of N-channel transistors, a first node coupled with the first pair of P-channel transistors, and a second node coupled with the first pair of N-channel transistors. The first control line is coupled with the first node and is shared by the first pair of P-channel transistors. The second control line is coupled with the second node and is shared by the first pair of N-channel transistors.

In the memory device and the memory system, according to example embodiments, vertical wiring between semiconductor layers may be possible, and as such, bitlines, complementary bitlines, and/or control lines may be electrically connected to a bitline sense amplifier that may be effectively disposed without significant space restrictions. Alternatively or additionally, control lines may be shared within a bitline sense amplifier, and a stable control voltage may be supplied without being affected by surrounding bitline sense amplifiers. Thus, an operational stability of the memory device may potentially be improved, when compared to related memory devices.

Additional aspects may be set forth in part in the description which follows and, in part, may be apparent from the description, and/or may be learned by practice of the presented embodiments.

BRIEF DESCRIPTION OF DRAWINGS

The above and other aspects, features, and advantages of certain embodiments of the present disclosure may be more apparent from the following description taken in conjunction with the accompanying drawings, in which:

FIG. 1 is a cross-sectional view of a memory device, according to example embodiments;

FIG. 13 is a block diagram illustrating a memory system, according to example embodiments;

DETAILED DESCRIPTION

Figure 2:
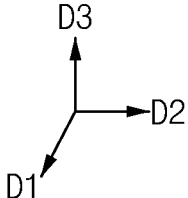
FIG. 2 is a perspective view of a memory device, according to example embodiments.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art may recognize that various changes and modifications of the embodiments described herein may be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It is to be understood that when an element or layer is referred to as being "over," "above," "on," "below," "under," "beneath," "connected to" or "coupled to" another element or layer, it may be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

As used herein, when an element or layer is referred to as "covering" another element or layer, the element or layer may cover at least a portion of the other element or layer, where the portion may include a fraction of the other element or may include an entirety of the other element. Similarly, when an element or layer is referred to as "surrounding" another element or layer, the element or layer may surround at least a portion of the other element or layer, where the portion may include a fraction of the other element or may include an entire dimension (e.g., length, width, depth) of the other element.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment. The embodiments described herein are example embodiments, and thus, the disclosure is not limited thereto and may be realized in various other forms.

It is to be understood that the specific order or hierarchy of blocks in the processes/flowcharts disclosed are an illustration of exemplary approaches. Based upon design preferences, it is understood that the specific order or hierarchy of blocks in the processes/flowcharts may be rearranged. Further, some blocks may be combined or omitted. The accompanying claims present elements of the various blocks in a sample order, and are not meant to be limited to the specific order or hierarchy presented.

The embodiments herein may be described and illustrated in terms of blocks, as shown in the drawings, which carry out a described function or functions. These blocks, which may be referred to herein as units or modules or the like, or by names such as device, logic, circuit, controller, counter, comparator, generator, converter, or the like, may be physically implemented by analog and/or digital circuits including one or more of a logic gate, an integrated circuit, a microprocessor, a microcontroller, a memory circuit, a passive electronic component, an active electronic component, an optical component, and the like.

In the present disclosure, the articles "a" and "an" are intended to include one or more items, and may be used interchangeably with "one or more." Where only one item is intended, the term "one" or similar language is used. For example, the term "a processor" may refer to either a single processor or multiple processors. When a processor is described as carrying out an operation and the processor is referred to perform an additional operation, the multiple operations may be executed by either a single processor or any one or a combination of multiple processors.

Hereinafter, various embodiments of the present disclosure are described with reference to the accompanying drawings.

FIG. 1 is a cross-sectional view of a memory device, according to example embodiments.

In FIG. 1, two directions that are each parallel or substantially parallel to a first surface (e.g., a top surface) of a substrate and crossing each other may be referred to as a first direction D1 (e.g., a X-axis direction) and a second direction D2 (e.g., a Y-axis direction). In addition, a direction vertical or substantially vertical to the first surface of the substrate may be referred to as a third direction D3 (e.g., a Z-axis direction). For example, the first and second directions D1 and D2 may be perpendicular or substantially perpendicular to each other. In addition, the third direction D3 may be perpendicular or substantially perpendicular to both the first and second directions D1 and D2. Further, a direction indicated by an arrow in the figures and a reverse direction thereof may be considered as the same direction. The first, second, and third directions D1, D2 and D3 may be the same as described above in the subsequent figures.

Referring to FIG. 1, a memory device 100 may include a first semiconductor layer 101 and a second semiconductor layer 102.

The first semiconductor layer 101 may include a first substrate SUB1, a first insulating layer IL1, a memory cell array MCA including a plurality of memory cells (e.g., first memory cell MC1 to N-th memory cell MCN, wherein N is a positive integer greater than zero (0)), a first bitline BL_1, a first complementary bitline BLB_1, a first vertical wire VL1, a second vertical wire VL2, a first bonding pad BP1, and a second bonding pad BP2. The second semiconductor layer 102 may include a second substrate SUB2, a second insulating layer IL2, a peripheral circuit PERI including a first bitline sense amplifier 150_1, a first control line LA, a second control line LAB, a third vertical wire VL3, a fourth vertical wire VL4, a third bonding pad BP3, and a fourth bonding pad BP4.

In some example embodiments, the memory device 100 may be and/or may include a volatile memory device. For example, the memory device 100 may be and/or may include any volatile memory, such as, but not limited to, dynamic random access memory (DRAM), synchronous DRAM (SDRAM), double data rate (DDR) SDRAM, low power DDR (LPDDR) SDRAM, graphics DDR (GDDR) SDRAM, DDR2 SDRAM, DDR3 SDRAM, DDR4 SDRAM, and the like. For example, the memory device 100 may have a cell over periphery (COP) structure in which the peripheral circuit PERI may be formed at the bottom and/or the memory cell array MCA may be stacked on the peripheral circuit PERI within a semiconductor fabrication process.

The first semiconductor layer 101 may represent a layer including the memory cell array MCA for storing data in a memory device having the COP structure. For example, the memory cell array MCA may include a plurality of memory cells MC1 to MCN.

The first substrate SUB1 may be and/or may include a support layer that may support components of the first semiconductor layer 101. The second substrate SUB2 may be and/or may include a support layer that may support components of the second semiconductor layer 102. For example, each of the first and second substrates SUB1 and SUB2 may be and/or may include a silicon (Si) substrate and may be referred to as a base substrate. In an embodiment, the first insulating layer IL1 may cover the components of the first semiconductor layer 101, and/or the second insulating layer IL2 may cover the components of the second semiconductor layer 102.

The first bitline BL_1 and the first complementary bitline BLB_1 may extend in the first direction D1 and may be connected to the memory cell array MCA. For example, a logic voltage level of the first complementary bitline BLB_1 may be opposite to a logic voltage level of the first bitline BL_1. In an embodiment, described with reference to FIG. 2, the first bitline BL_1 and the first complementary bitline BLB_1 may be disposed along the second direction D2 crossing the first direction D1. For example, the first direction D1 may indicate a direction parallel to the first bitline BL_1 and the first complementary bitline BLB_1. As another example, the second direction D2 may indicate a direction perpendicular to the first bitline BL_1 and the first complementary bitline BLB_1 and a direction parallel to a wordline (e.g., wordline WL in FIG. 2). In an embodiment, data may be read from and/or written to the plurality of memory cells MC1 to MCN via the first bitline BL_1, the first complementary bitline BLB_1, a plurality of wordlines, and the first bitline sense amplifier 150_1.

A first vertical wire VL1 may be connected to the first bitline BL_1, and a second vertical wire VL2 may be connected to the first complementary bitline BLB_1. For example, the first vertical wire VL1 and the second vertical wire VL2 may be portions of a plurality of vertical wires electrically connecting the memory cell array MCA and the first bitline sense amplifier 150_1. Alternatively or additionally, the first vertical wire VL1 and the second vertical wire VL2 may be connected to the first bonding pad BP1 and the second bonding pad BP2, respectively.

The second semiconductor layer 102 may represent a layer including the peripheral circuit PERI other than the memory cell array MCA in a memory device (e.g., memory device 100) having a COP structure. For example, the peripheral circuit PERI may include the first bitline sense amplifier 150_1. The second semiconductor layer 102 may be disposed in the third direction D3 perpendicular to the first and second directions D1 and D2 with respect to the first semiconductor layer 101. In an embodiment, the first semiconductor layer 101 may be stacked on the second semiconductor layer 102 in the third direction D3, and the second semiconductor layer 102 may be disposed below the first semiconductor layer 101 in the third direction D3. However, example embodiments are not limited thereto. For example, the memory device 100 may be turned over during the manufacturing process, and thus, the first semiconductor layer 101 may be stacked on the second semiconductor layer 102 in the third direction D3.

The third bonding pad BP3 and the fourth bonding pad BP4 may be connected to the first bonding pad BP1 and the second bonding pad BP2, respectively. For example, the third vertical wire VL3 and the fourth vertical wire VL4 may be electrically connected to the first vertical wire VL1 and the second vertical wire VL2 via the third bonding pad BP3 and fourth bonding pad BP4, respectively. As another example, the third vertical wire VL3 and the fourth vertical wire VL4 may be connected to the first bitline sense amplifier 150_1. Alternatively or additionally, the third vertical wire VL3 may be connected to a drain of a transistor TR included in the first bitline sense amplifier 150_1, and the fourth vertical wire VL4 may be connected to a source of the transistor TR included in the first bitline sense amplifier 150_1.

In some example embodiments, the first semiconductor layer 101 and the second semiconductor layer 102 may be connected to each other using a bonding method. For example, the bonding method may refer to a method of electrically and/or physically connecting the first and second bonding pads BP1 and BP2 of the first semiconductor layer 101 and the third and fourth bonding pads BP3 and BP4 of the second semiconductor layer 102. As another example, the bonding method may refer to a method of electrically and/or physically connecting a bonding metal pattern formed in an uppermost metal layer of the upper chip to a bonding metal pattern formed in an uppermost metal layer of the lower chip. For example, in a case in which the bonding metal patterns of the first to fourth bonding pads BP1 to BP4 are formed of copper (Cu), the bonding method may be referred to as a Cu—Cu bonding method. Alternatively or additionally, the bonding metal patterns may be formed of other metals such as, but not limited to, aluminum (Al), tungsten (W), and the like.

In some example embodiments, the first semiconductor layer 101 may be fabricated by forming the memory cell array MCA, the first and second vertical wires VL1 and VL2, the first and second bonding pads BP1 and BP2, and the first insulating layer IL1 on the first substrate SUB1. The second semiconductor layer 102 may be fabricated by forming the peripheral circuit PERI, the third and fourth vertical wires VL3 and VL4, the third and fourth bonding pads BP3 and BP4, and the second insulating layer IL2 on the second substrate SUB2. For example, the first and second semiconductor layers 101 and 102 may be electrically connected in the third direction D3 by turning over the first semiconductor layer 101 and connecting the first to fourth bonding pads BP1 to BP4 using the bonding method.

The first bitline sense amplifier 150_1 may control the memory cell array MCA and control the first bitline BL_1 and the first complementary bitline BLB_1. For example, when a read operation and/or refresh operation is performed on the first bitline sense amplifier 150_1 in the memory device 100, a voltage level difference between the first bitline BL_1 and the first complementary bitline BLB_1 may be amplified. As another example, the first bitline sense amplifier 150_1 may be connected to the first control line LA and the second control line LAB that may control the first bitline sense amplifier 150_1. In an embodiment, the first bitline sense amplifier 150_1 may include at least one transistor pair sharing (or shared by) at least one of the first control line LA and the second control line LAB. That is, a case where at least one transistor pair shares (or is shared by) the first control line LA or the second control line LAB may indicate a case where both drains and sources of the at least one transistor pair may be commonly connected to the first control line LA or the second control line LAB. In an embodiment, at least one of the first control line LA and the second control line LAB may be connected only to transistors in the first bitline sense amplifier 150_1, so that the sensing and amplification operations may be performed without being affected by adjacent or neighboring bitline sense amplifiers.

Operations of the first control line LA and the second control line LAB controlling the first bitline sense amplifier 150_1 are described with reference to FIGS. 6 to 10. An example of a circuit configuration of the first bitline sense amplifier 150_1 is described with reference to FIG. 3.

In the memory device 100, the components in different semiconductor layers may be electrically connected via the vertical wires, and thus, the first bitline BL_1, the first complementary bitline BLB_1, and the first and second control lines LA and LAB electrically connected to the first bitline sense amplifier 150_1 may be effectively disposed without significant space restrictions. The first and second control lines LA and LAB may be shared within the first bitline sense amplifier 150_1, and a stable control voltage may be supplied without being affected by surrounding bitline sense amplifiers. Consequently, operational stability of the memory device may be improved, when compared to related memory devices.

FIG. 2 is a perspective view of a memory device, according to example embodiments.

Referring to FIG. 2, a memory device 100a may be an example of the memory device 100 of FIG. 1. That is, the memory device 100a of FIG. 2 may include and/or may be similar in many respects to the memory device 100 described above with reference to FIG. 1, and may include additional features not mentioned above. A first semiconductor layer 101a may correspond to the first semiconductor layer 101 in FIG. 1, and a second semiconductor layer 102a may correspond to the second semiconductor layer 102 in FIG. 1. A first bitline sense amplifier 150_1a may correspond to the first bitline sense amplifier 150_1 in FIG. 1. First to fourth vertical wires VL1 to VL4, first to fourth bonding pads BP1 to BP4, first and second control lines LA and LAB, a first bitline BL_1, and a first complementary bitline BLB_1 may include and/or may be similar in many respects to those in FIG. 1 . . . . Consequently, repeated descriptions of the memory device 100a described above with reference to FIG. 1 may be omitted for the sake of brevity.

For example, the memory device 100a may have a structure in which the first semiconductor layer 101a and the second semiconductor layer 102a may be stacked in the third direction D3. In an embodiment, the first semiconductor layer 101a and the second semiconductor layer 102a may be electrically connected via the first to fourth vertical wires VL1 to VL4, and the first to fourth bonding pads BP1 to BP4. For example, when the first bitline BL_1 and the first complementary bitline BLB_1 are connected to the first bitline sense amplifier 150_1a in the third direction D3, wiring may be less complex (e.g., more compact) to implement, when compared to the bitline and the complementary bitline being connected to the bitline sense amplifier in the first direction D1 within the same semiconductor layer.

In some example embodiments, the first bitline sense amplifier 150_1a may include transistors (e.g., first transistor P1_a, second transistor P1_b, third transistor N1_a, and fourth transistor N1_b). For example, as described with reference to FIG. 4A, in a plane (or layout) view, the first bitline BL_1 may be electrically connected to the first transistor P1_*a* and the third transistor N1_*a* in the first direction D1. As another example, as further described with reference to FIG. 4A, in a plane (or layout) view, the first complementary bitline BLB_1 may be electrically connected to the second transistor P1_*b* and the fourth transistor N1_*b* in the first direction D1.

In an embodiment, the first transistor P1_*a* and the second transistor P1_*b* may be disposed adjacent to each other in the second direction D2. The first control line LA may be electrically connected to the first transistor P1_*a* and the second transistor P1_*b*. That is, the first transistor P1_*a* and the second transistor P1_*b* may share the first control line LA.

In an embodiment, the third transistor N1_*a* and the fourth transistor N1_*b* may be disposed adjacent to each other in the second direction D2. For example, the second control line LAB may be electrically connected to the third transistor N1_*a* and the fourth transistor N1_*b*. That is, the third transistor N1_*a* and the fourth transistor N1_*b* may share the second control line LAB.

The first bitline sense amplifier 150_1*a* may include two pairs of transistors that may be disposed adjacent to each other in the second direction D2 and that may share the first and second control lines LA and LAB. However, the structure of the bitline sense amplifier is not limited thereto.

Figure 3:
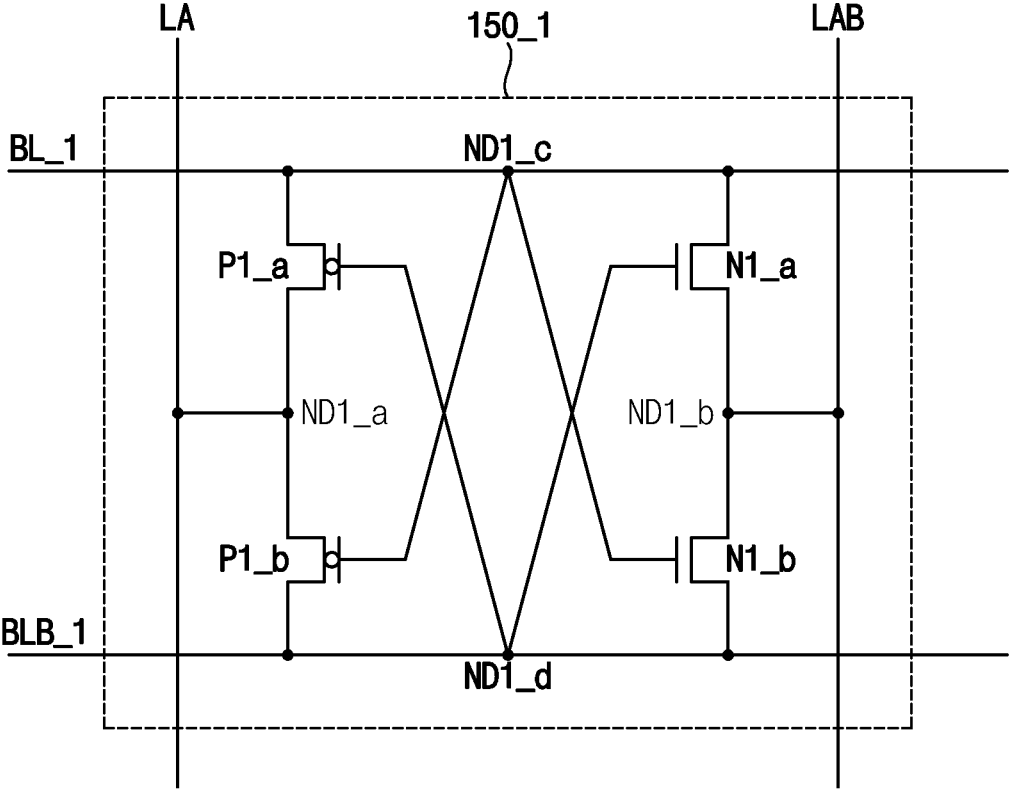
FIG. 3 is a circuit diagram of a first bitline sense amplifier included in a memory device, according to example embodiments.

FIG. 3 is a circuit diagram of a first bitline sense amplifier included in a memory device, according to example embodiments.

Referring to FIG. 3, a first bitline sense amplifier 150_1 may be an example of the first bitline sense amplifier 150_1 in FIG. 1. As shown in FIG. 3, the first bitline sense amplifier 150_1 may include first to fourth transistors P1_*a* to N1_*b*. In some example embodiments, the first transistor P1_*a* and the second transistor P1_*b* may be classified as P-channel transistors, and the third transistor N1_*a* and fourth transistor N1_*b* may be classified as N-channel transistors. For example, a P-channel transistor may be and/or may include a p-type metal-oxide semiconductor (PMOS) transistor, and an N-channel transistor may be an n-type metal-oxide semiconductor (NMOS) transistor. In an embodiment, the first transistor P1_*a* and the second transistor P1_*b* may be referred to as a pair of first P-channel transistors, and/or the third transistor N1_*a* and the fourth transistor N1_*b* may be referred to as a pair of first N-channel transistors.

In an embodiment, a source of the first transistor P1_*a* and a source of the second transistor P1_*b* may be connected to the first control line LA via the first node ND1_*a*. A source of the third transistor N1_*a* and a source of the fourth transistor N1_*b* may be connected to the second control line LAB via the second node ND1_*b*. In an embodiment, the first node ND1_*a* and the second node ND1_*b* may be referred to as a first source node and a second source node of the first bitline sense amplifier 150_1, respectively.

Alternatively or additionally, a drain of the first transistor P1_*a* and a drain of the third transistor N1_*a* may be connected to the first bitline BL_1 via a first drain node ND1_*c*. A drain of the second transistor P1_*b* and a drain of the fourth transistor N1_*b* may be connected via a second drain node ND1_*d*.

In an embodiment, the first bitline sense amplifier 150_1 may sense a voltage level change of the first bitline BL_1 and amplify the voltage level change. When the first bitline sense amplifier 150_1 performs sensing and amplification operations, the first node ND1_*a* may be connected to the power supply voltage terminal of the memory device through the first control line LA, and the second node ND1_*b* may be connected to the ground terminal through the second control line LAB. Thus, a power supply voltage may be applied to the first node ND1_*a*, and a ground voltage may be applied to the second node ND1_*b*.

Figure 12:
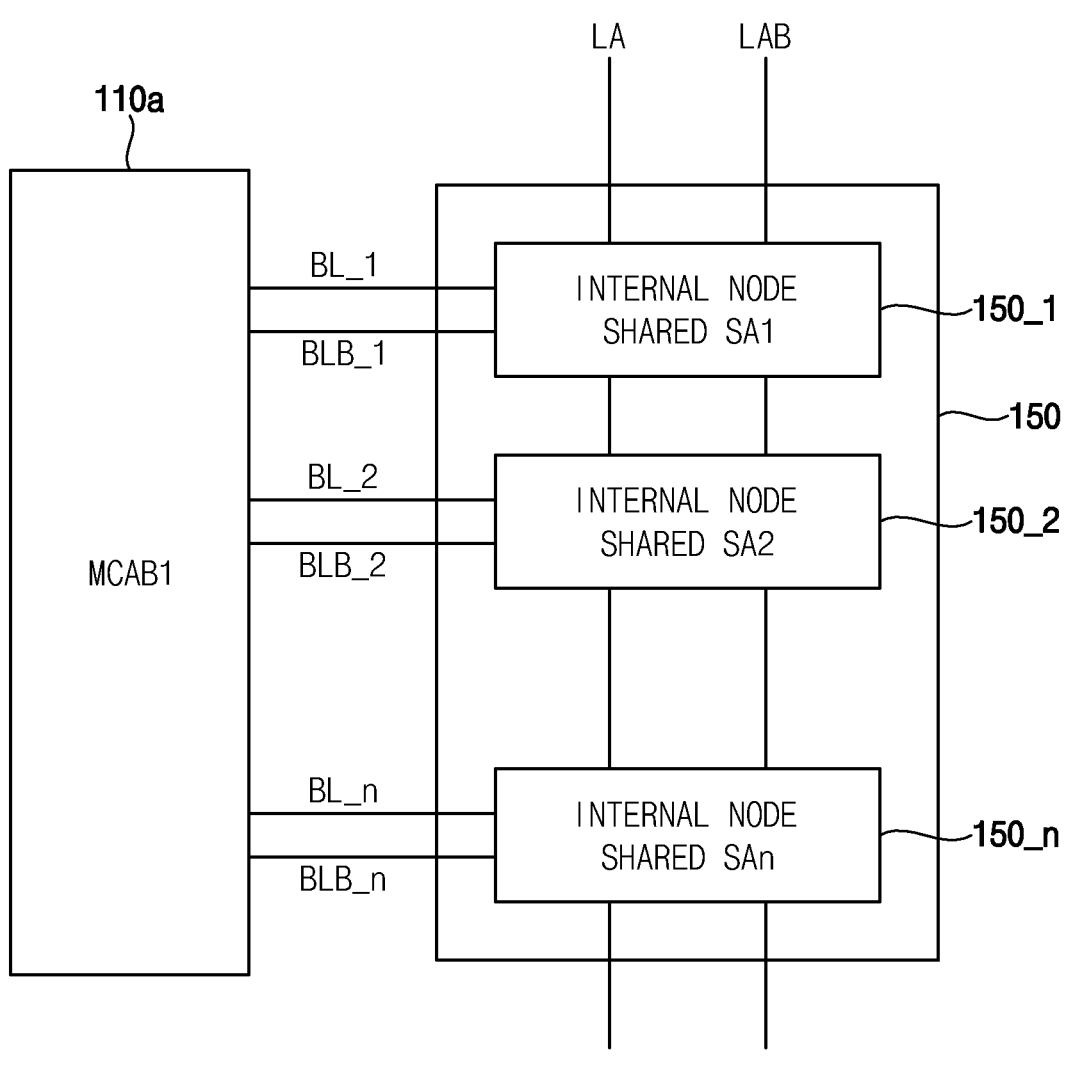
FIG. 12 is a diagram for describing a bitline voltage sensing operation of a first bitline sense amplifier included in a memory device, according to example embodiments.

A circuit configuration of the first bitline sense amplifier 150_1 described above with reference to FIG. 3 may be applied to the second to n-th bitline sense amplifiers 150_2 to 150_*n* in FIG. 12. For example, the first bitline sense amplifier 150_1 may be referred to as an internal node shared bitline sense amplifier. In FIG. 3, the first bitline sense amplifier 150_1 may be implemented in a circuit configuration in which a pair of first P-channel transistors and a pair of first N-channel transistors are included, and the transistors are cross-coupled. However, circuit configurations of the first bitline sense amplifier 150_1 may not be limited thereto. For example, FIG. 3 illustrates an equivalent circuit diagram of the first bitline sense amplifier 150_1, and depending on the layout structure of the bitline sense amplifier, the actual circuit configuration of the first bitline sense amplifier 150_1 may be different from the circuit configuration in FIG. 3.

FIGS. 4A, 4B, 4C, and 4D are diagrams illustrating examples of layout structures of a first bitline sense amplifier included in a memory device, according to example embodiments.

Figure 4A:
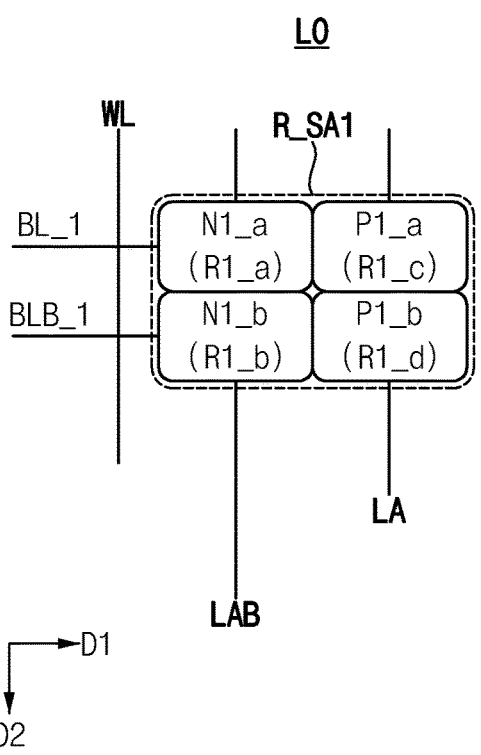
FIGS. 4A, 4B, 4C, and 4D are diagrams illustrating examples of layout structure of a first bitline sense amplifier included in a memory device, according to example embodiments.

Referring to FIG. 4A, a layout structure LO of a bitline sense amplifier may be an example of a layout structure of the first bitline sense amplifier 150_1 in FIG. 1. For example, the bitline sense amplifier may include first to fourth transistors P1_*a* to N1_*b*.

The layout structure LO of the bitline sense amplifier may include a first bitline sense amplifier area R_SA1. For example, the first bitline sense amplifier area R_SA1 may include a region R1_*a* where the third transistor N1_*a* is disposed, a region R1_*b* where the fourth transistor N1_*b* is disposed, a region R1_*c* where the first transistor P1_*a* is disposed, and a region R1_*d* where the second transistor P1_*b* is disposed.

In a perspective view, a wordline WL, a first bitline BL_1, and a first complementary bitline BLB_1 may be formed in a different semiconductor layer from the first bitline sense amplifier region R_SA1. In a plane view, the wordline WL, the first bitline BL_1, and the first complementary bitline BLB_1 may be disposed to overlap the first bitline sense amplifier area R_SA1. Hereinafter, the layout structure LO of the bitline sense amplifier may be described based on the plane view, unless noted otherwise.

In an example of transistor disposition or arrangement in the first bitline sense amplifier area R_SA1, the third transistor N1_*a* may be disposed adjacent to the fourth transistor N1_*b* in the second direction D2, and the first transistor P1_*a* may be disposed adjacent to the second transistor P1_*b* in the second direction D2. For example, the first transistor P1_*a* may be disposed adjacent to the third transistor N1_*a* in the first direction D1. Accordingly, in the layout structure LO of the bitline sense amplifier, a source of the first transistor P1_*a* and a source of the second transistor P1_*b* may be connected to a first control line LA, and a source of the third transistor N1_*a* and a source of the fourth transistor N1_*b* may be connected to a second control line LAB.

For example, the layout structure LO of the first bitline sense amplifier may stably supply the gate threshold voltage because the first and second control lines LA and LAB may not be connected to other bitline sense amplifiers. Thus, a noise generated by the other bitline sense amplifiers may be potentially reduced, and the sensing margin of the bitline sense amplifier may be potentially improved.

Figure 4B:
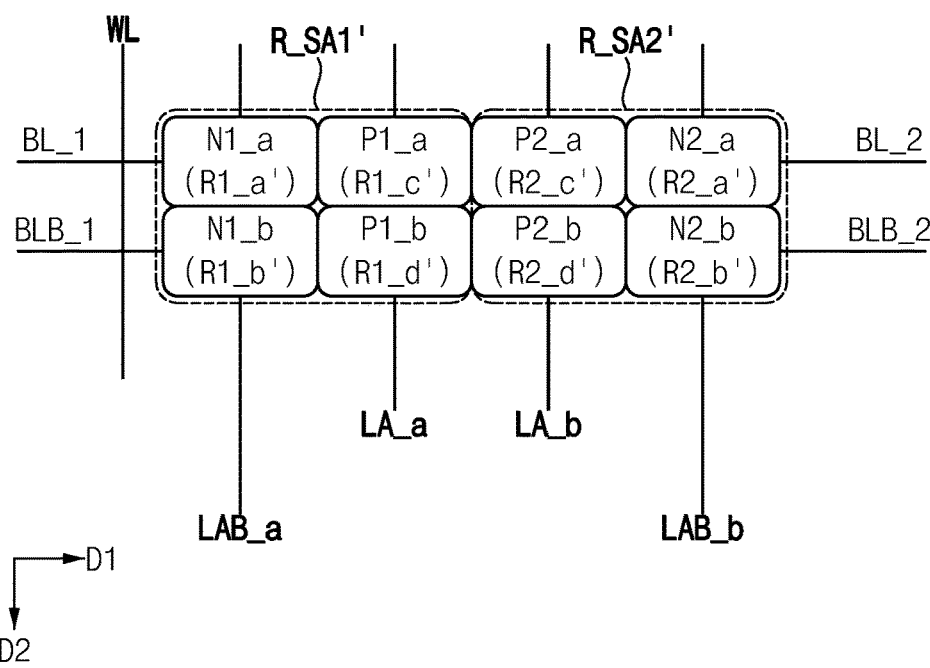

Referring to FIG. 4B, a layout structure LO_a of a first bitline sense amplifier may be an example of a layout structure of the first bitline sense amplifier disposed adjacent to a second bitline sense amplifier. For example, the first bitline sense amplifier may include first to fourth transistors P1_a to N1_b, and the second bitline sense amplifier may include fifth transistor P2_a, sixth transistor P2_b, seventh transistor N2_a, and eighth transistor N2_b.

The layout structure LO_a of the first bitline sense amplifier may include a first bitline sense amplifier area R_SA1'. As described above with reference to FIG. 4A, a first bitline BL_1 and a first complementary bitline BLB_1 may be formed in the first direction D1, and a wordline WL may be formed in the second direction D2 perpendicular to the first direction D1. For example, the first bitline sense amplifier area R_SA1' may include a region R1_a' where the third transistor N1_a is disposed, a region R1_b' where the fourth transistor N1_b is disposed, a region R1_c' where the first transistor P1_a is disposed, and a region R1_d' where the second transistor P1_b is disposed.

A transistor disposition of the first bitline sense amplifier area R_SA1' may be substantially similar and/or the same as the transistor disposition of the first bitline sense amplifier area R_SA1 in FIG. 4A.

In an example of transistor disposition in the second bitline sense amplifier area R_SA2', the seventh transistor N2_a may be disposed adjacent to the eighth transistor N2_b in the second direction D2, and the fifth transistor P2_a may be disposed adjacent to the sixth transistor P2_b in the second direction D2. The seventh transistor N2_a may be disposed adjacent to the fifth transistor P2_a in the first direction D1. Accordingly, in the layout structure LO_a of the first bitline sense amplifier, a source of the fifth transistor P2_a and a source of the sixth transistor P2_b may be connected to the third control line LA_b, and a source of the seventh transistor N2_a and a source of the eighth transistor N2_b may be connected to the fourth control line LAB_b.

In some example embodiments, in the layout structure LO_a of the first bitline sense amplifier, the second bitline sense amplifier area R_SA2' may be adjacent to the first bitline sense amplifier area R_SA1' in the first direction D1. That is, the second bitline sense amplifier may be disposed adjacent to the first bitline sense amplifier in the first direction D1.

Figures 4C, 4D:
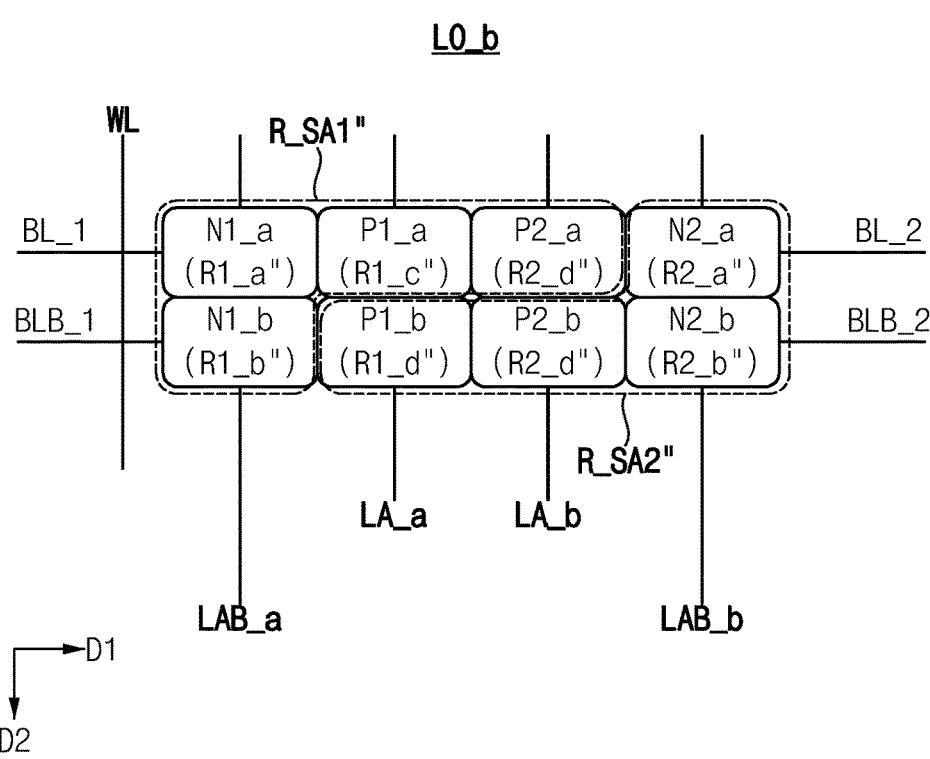

Referring to FIG. 4C, a layout structure LO_b of a bitline sense amplifier may be an example of a layout structure of a first bitline sense amplifier disposed adjacent to a second bitline sense amplifier. Hereinafter, descriptions repeated with FIG. 4B may be omitted for the sake of brevity.

In FIG. 4C, unlike the layout structure LO_a of the bitline sense amplifier in FIG. 4B, among the transistor pairs included in the first bitline sense amplifier, only one pair of N-channel transistors (e.g., third transistor N1_a and fourth transistor N1_b) may be connected to a second control line LAB_a. That is, the layout structure LO_b of the bitline sense amplifier may represent a layout structure of a bitline sense amplifier in which only a pair of N-channel transistors share the second node ND1_b in FIG. 3.

In an embodiment, the layout structure LO_b of the bitline sense amplifier may include a first bitline sense amplifier area R_SA1" and a second bitline sense amplifier area R_SA2". For example, the first bitline sense amplifier area R_SA1" may include a region R1_a" where the third transistor N1_a is disposed, a region R1_b" where the fourth transistor N1_b is disposed, a region R1_c" where the first transistor P1_a is disposed, and a region R1_d" where the second transistor P1_b is disposed.

In an example of transistor disposition in the first bitline sense amplifier area R_SA1", the third transistor N1_a may be disposed adjacent to the fourth transistor N1_b in the second direction D2, and the second transistor P1_b may be disposed adjacent to the first transistor P1_a in the first direction D1. The first transistor P1_a may be disposed adjacent to the third transistor N1_a in the first direction D1. Accordingly, in the layout structure LO_b of the bitline sense amplifier, a source of the third transistor N1_a and a source of the fourth transistor N1_b may be connected to a second control line LAB_a, and a source of the first transistor P1_a and a source of the second transistor P1_b may be connected to different control lines LA_a and LA_b, respectively.

Since the transistor disposition example of the second bitline sense amplifier area R_SA2" may be substantially similar and/or the same as the first bitline sense amplifier area R_SA1", repeated descriptions of the second bitline sense amplifier area R_SA2" may be omitted for the sake of brevity.

For example, in the layout structure LO_b of the bitline sense amplifier, the first transistor P1_a and the fifth transistor P2_a may be connected to the first control line LA_a, and the second transistor P1_b and the sixth transistor P2_b may be connected to the third control line LA_b.

Referring to FIG. 4D, the layout structure LO_c of the bitline sense amplifier may be an example of a layout structure of a first bitline sense amplifier disposed adjacent to the second bitline sense amplifier. Hereinafter, descriptions of the layout structure LO_c repeated with FIG. 4B may be omitted for the sake of brevity.

In FIG. 4D, unlike the layout structure LO_a of the bitline sense amplifier in FIG. 4B, among the transistor pairs included in the first bitline sense amplifier, only one pair of P-channel transistors P1_a-P1_b may be connected to a first control line LA_a. That is, the layout structure LO_c of the bitline sense amplifier may indicate a layout structure of a bitline sense amplifier in which only a pair of P-channel transistors P1_a-P1_b share the first node ND1_a in FIG. 3.

In an embodiment, the layout structure LO_c of the bitline sense amplifier may include a first bitline sense amplifier area R_SA1" and a second bitline sense amplifier area R_SA2'". For example, the first bitline sense amplifier area R_SA1" may include a region R1_a'" where the third transistor N1_a is disposed, a region R1_b" where the fourth transistor N1_b is disposed, a region R1_c" where the first transistor P1_a is disposed, and a region R1_d'" where the second transistor P1_b is disposed.

In an example of transistor disposition in the first bitline sense amplifier area R_SA1", the first transistor P1_a may be disposed adjacent to the third transistor N1_a in the first direction D1, and the second transistor P1_b may be disposed adjacent to the first transistor P1_a in the second direction D2. The fourth transistor N1_b may be disposed at a certain distance from the first transistor P1_a in the first direction D1. Accordingly, in the layout structure LO_c of the bitline sense amplifier, a source of the first transistor P1_a and a source of the second transistor P1_b may be connected to the first control line LA_a. However, a source of the third transistor N1_a and a source of the fourth transistor N1_b may be connected to different control lines LAB_a and LAB_b, respectively.

Since the transistor disposition example of the second bitline sense amplifier area R_SA2" may be substantially similar and/or the same as the first bitline sense amplifier area R_SA1", repeated descriptions of the second bitline sense amplifier area R_SA2" may be omitted for the sake of brevity.

Layout structure of the memory device according to example embodiments is not limited thereto. While maintaining the layout structure LO_a of the bitline sense amplifier in FIG. 4B, only two pairs of P-channel transistors (e.g., a first pair with first transistor P1_a and second transistor P1_b and a second pair with fifth transistor P2_a and sixth transistor P2_b) from among the transistor pairs may be connected to control line LA_a and LA_b, respectively. For example, the layout structure LO_c of the bitline sense amplifier may be implemented so that a pair of P-channel transistors (e.g., first transistor P1_a and second transistor P1_b) share the first node ND1_a in FIG. 3.

Figure 5A:
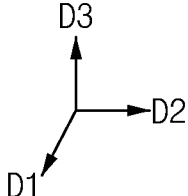
FIGS. 5A, 5B, and 5C are perspective views of examples of a memory device, according to example embodiments.
Figure 5B:
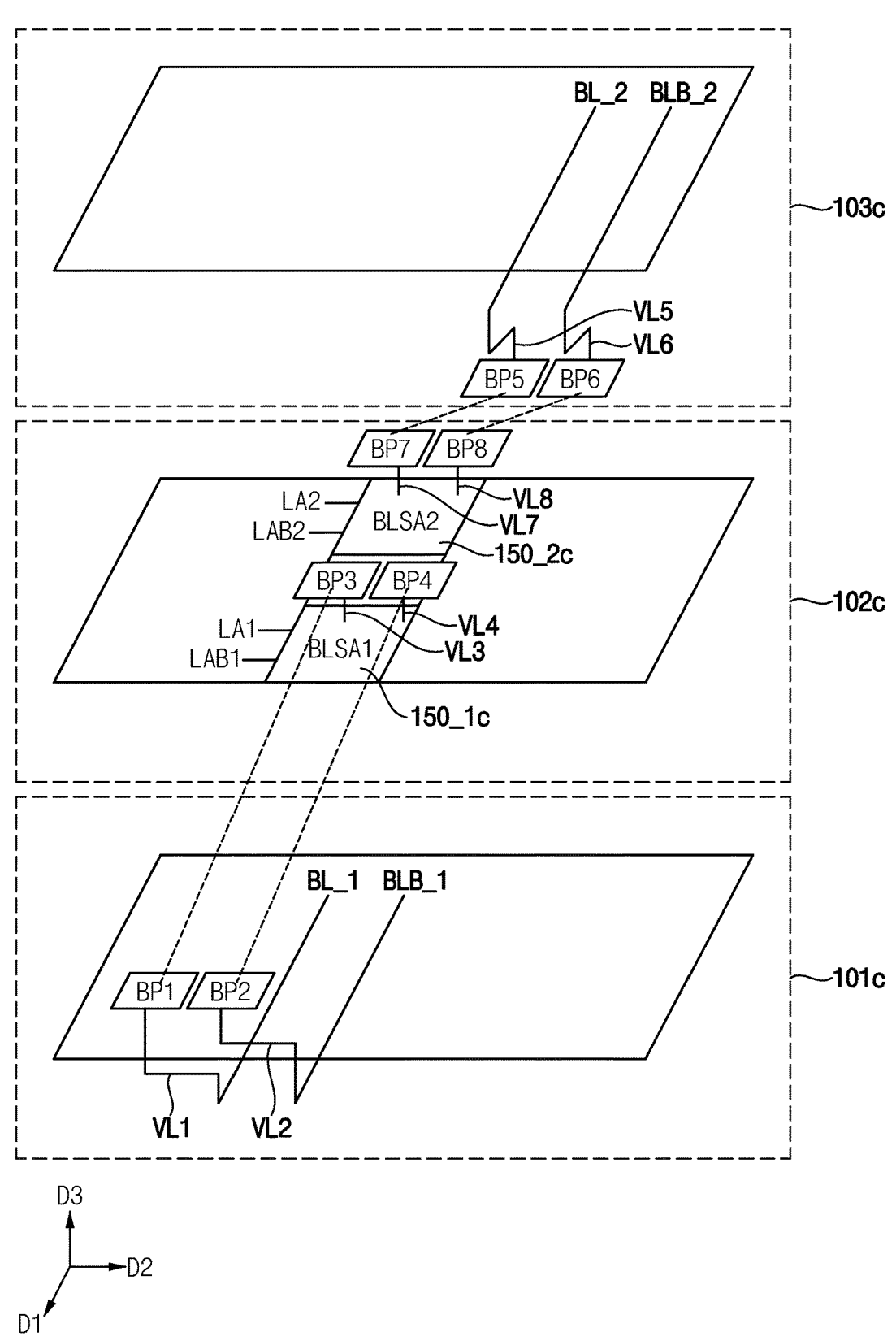
Figure 5C:
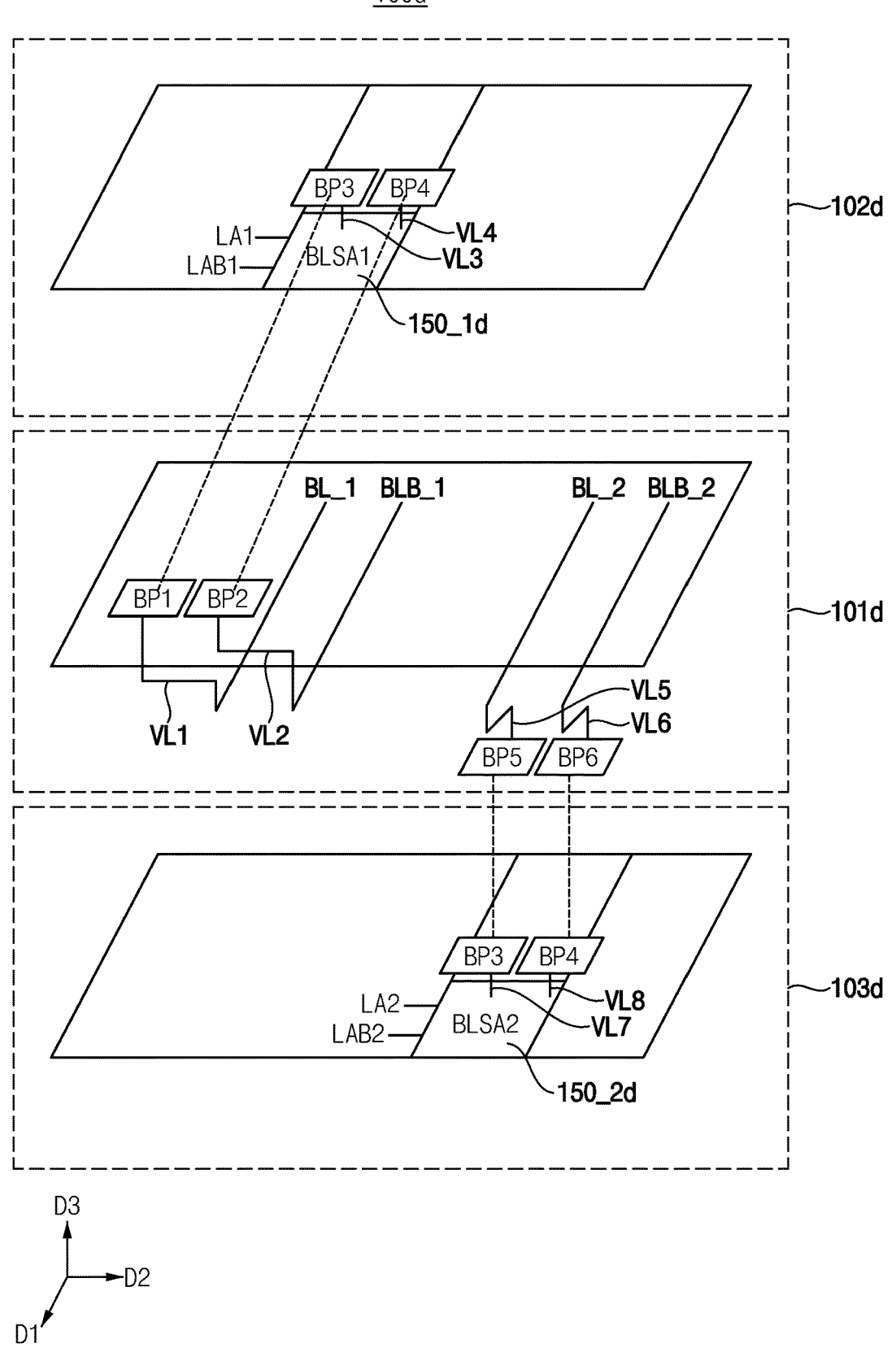

FIGS. 5A, 5B, and 5C are perspective views of examples of a memory device, according to example embodiments.

Referring to FIG. 5A, a memory device 100b may be an example of the memory device 100 in FIG. 1. That is, the memory device 100b of FIG. 5A may include and/or may be similar in many respects to the memory device 100 and the memory device 100a described above with reference to FIGS. 1 and 2, and may include additional features not mentioned above. First to fourth vertical wires VL1 to VL4, first to fourth bonding pads BP1 to BP4, a first and a second control lines LA and LAB, a first bitline BL_1, and a first complementary bitline BLB_1 may be substantially similar and/or the same as those described with reference to FIGS. 1 and 2. Hereinafter, descriptions repeated with FIGS. 1 and 2 will be omitted. Consequently, repeated descriptions of the memory device 100b described above with reference to FIGS. 1 and 2 may be omitted for the sake of brevity.

For example, the memory device 100b may be an example in which a second bitline sense amplifier 150_2b is additionally disposed in the memory device 100a in FIG. 2. As another example, the first semiconductor layer 101b may further include a second bitline BL_2, a second complementary bitline BLB_2, a fifth vertical wire VL5, a sixth vertical wire VL6, a fifth bonding pad BP5, and a sixth bonding pad BP6. In an embodiment, the second semiconductor layer 102b may further include a second bitline sense amplifier 150_2b, a third control line LA2, a fourth control line LAB2, a seventh vertical wire VL7, an eighth vertical wire VL8, a seventh bonding pad BP7, and an eighth bonding pad BP8.

In an embodiment, the second bitline BL_2 and the second complementary bitline BLB_2 may be disposed in the second direction D2 with the first bitline BL_1 and the first complementary bitline BLB_1. In some example embodiments, the second bitline sense amplifier 150_2b may be disposed in the first direction D1 with the first bitline sense amplifier 150_1b. The fifth bonding pad BP5 and the sixth bonding pad BP6 may be physically connected to the seventh bonding pad BP7 and the eighth bonding pad BP8, respectively. The third and fourth control lines LA2 and LAB2 may control the second bitline sense amplifier 150_2b. In an embodiment, as described with reference to FIG. 3, a pair of P-channel transistors and a pair of N-channel transistors included in the second bitline sense amplifier 150_2b may share the third control line LA2 and the fourth control line LAB2, respectively.

In an embodiment, control lines may not be shared between bitline sense amplifiers. For example, the first bitline sense amplifier 150_1b may be connected to the first and second control lines LA1 and LAB1, and the second bitline sense amplifier 150_2b may be connected to the third and fourth control lines LA2 and LAB2. That is, the first bitline BL_1 and the first complementary bitline BLB_1 may be connected to the first bitline sense amplifier 150_1b in the third direction D3, and the second bitline BL_2 and the second complementary bitline BLB_2 may be connected to the second bitline sense amplifier 150_2b in the third direction D3. Thus, even when the second bitline sense amplifier 150_2b is disposed adjacent to the first bitline sense amplifier 150_1b in the first direction D1, wiring may be comparatively less complex, when compared to related memory devices.

Referring to FIG. 5B, a memory device 100c may be an example of the memory device 100 in FIG. 1. That is, the memory device 100c of FIG. 5B may include and/or may be similar in many respects to the memory devices 100, 100a, and 100b described above with reference to FIGS. 1, 2, and 5A, respectively, and may include additional features not mentioned above. Consequently, repeated descriptions of the memory device 100c described above with reference to FIGS. 1, 2, and 5A may be omitted for the sake of brevity.

For example, the memory device 100c may be an example in which a third semiconductor layer 103c may be additionally stacked on the memory device 100b in FIG. 5A, and a second bitline BL_2 and a second complementary bitline BLB_2 may be disposed on the third semiconductor layer 103c. For example, the third semiconductor layer 103c may include the second bitline BL_2, the second complementary bitline BLB_2, a fifth vertical wire VL5, a sixth vertical wire VL6, a fifth bonding pad BP5, and a sixth bonding pad BP6. For example, a first semiconductor layer 101c may include a first bitline BL_1, a first complementary bitline BLB_1, a first vertical wire VL1, a second vertical wire VL2, a first bonding pad BP1, and a second bonding pad BP2. A second semiconductor layer 102c may be substantially similar and/or the same as the second semiconductor layer 102b described with reference to FIG. 5A. For example, the fifth bonding pad BP5 and the sixth bonding pad BP6 may be connected to the seventh bonding pad BP7 and the eighth bonding pad BP8, respectively.

In an embodiment, the first bitline BL_1 and the second bitline BL_2 may be disposed on the first semiconductor layer 101c, and the first complementary bitline BLB_1 and the second complementary bitline BLB_2 may be disposed on the third semiconductor layer 103c. Thus, even when the second bitline sense amplifier 150_2c is disposed adjacent to the first bitline sense amplifier 150_1c in the first direction D1, wiring may be comparatively less complex, when compared to related memory devices.

In FIG. 5B, an example of a structure in which the second semiconductor layer 102c is disposed between the first semiconductor layer 101c and the third semiconductor layer 103c is illustrated. In other example embodiments, the second semiconductor layer 102c may be located at the bottom, and various interlayer dispositions of semiconductor layers may be achieved.

Referring to FIG. 5C, a memory device 100d may be an example of the memory device 100 in FIG. 1. That is, the memory device 100d of FIG. 5C may include and/or may be similar in many respects to the memory devices 100, 100a, 100b, and 100c described above with reference to FIGS. 1, 2, 5A, and 5B, respectively, and may include additional features not mentioned above. Consequently, repeated descriptions of the memory device 100d described above with reference to FIGS. 1, 2, 5A, and 5B may be omitted for the sake of brevity.

For example, the memory device 100d may be an example in which a third semiconductor layer 103d may be additionally stacked on the memory device 100b in FIG. 5A, and a second bitline sense amplifier 150_2d is disposed on the third semiconductor layer 103c. The third semiconductor layer 103d may include a third control line LA2, a fourth control line LAB2, the second bitline sense amplifier 150_2d, a seventh vertical wire VL7, an eighth vertical wire VL8, a seventh bonding pad BP7, and an eighth bonding pad BP8. A second semiconductor layer 102d may include a first control line LA1, a second control line LAB1, a first bitline sense amplifier 150_1d, a third vertical wire VL3, a fourth vertical wire VL4, a third bonding pad BP3, and a fourth bonding pad BP4. A first semiconductor layer 101d may be substantially similar and/or the same as the first semiconductor layer 101b described with reference to FIG. 5A. For example, the fifth bonding pad BP5 and the sixth bonding pad BP6 may be connected to the seventh bonding pad BP7 and the eighth bonding pad BP8, respectively.

In an embodiment, the first bitline sense amplifier 150_1d and the second bitline sense amplifier 150_2d may be located in the second semiconductor layer 102d and the third semiconductor layer 103d, respectively. Thus, even when the second bitline sense amplifier 150_2d is disposed adjacent to the first bitline sense amplifier 150_1d in the first direction D1, wiring may be comparatively less complex, when compared to related memory devices.

In FIG. 5C, an example of a structure in which the first semiconductor layer 101d is disposed between the second semiconductor layer 102d and the third semiconductor layer 103d is illustrated. In other example embodiments, the first semiconductor layer 101d may be located at the top, and various interlayer dispositions of semiconductor layers may be achieved.

FIGS. 6, 7, 8, 9, and 10 are diagrams of operations of a first bitline sense amplifier included in a memory device, according to example embodiments.

Figure 6:
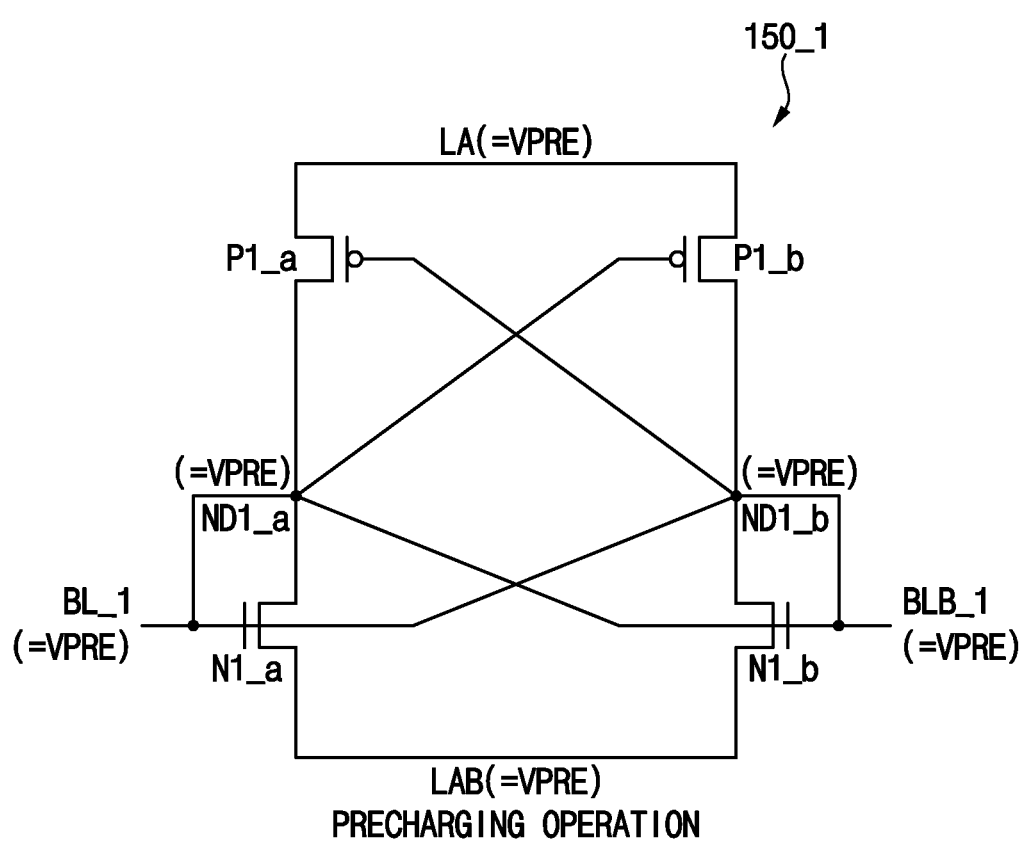
FIGS. 6, 7, 8, 9, and 10 are diagrams of operations of a first bitline sense amplifier included in a memory device, according to example embodiments.

Referring to FIG. 6, a bitline sense amplifier 150_1 may precharge a bitline BL_1 and a complementary bitline BLB_1 to a precharge voltage VPRE. Accordingly, the bitline BL_1 and the complementary bitline BLB_1 may be connected to one node and be precharged to the precharge voltage VPRE. Consequently, a first control line LA and a second control line LAB may be precharged to the precharge voltage VPRE.

Figure 7:
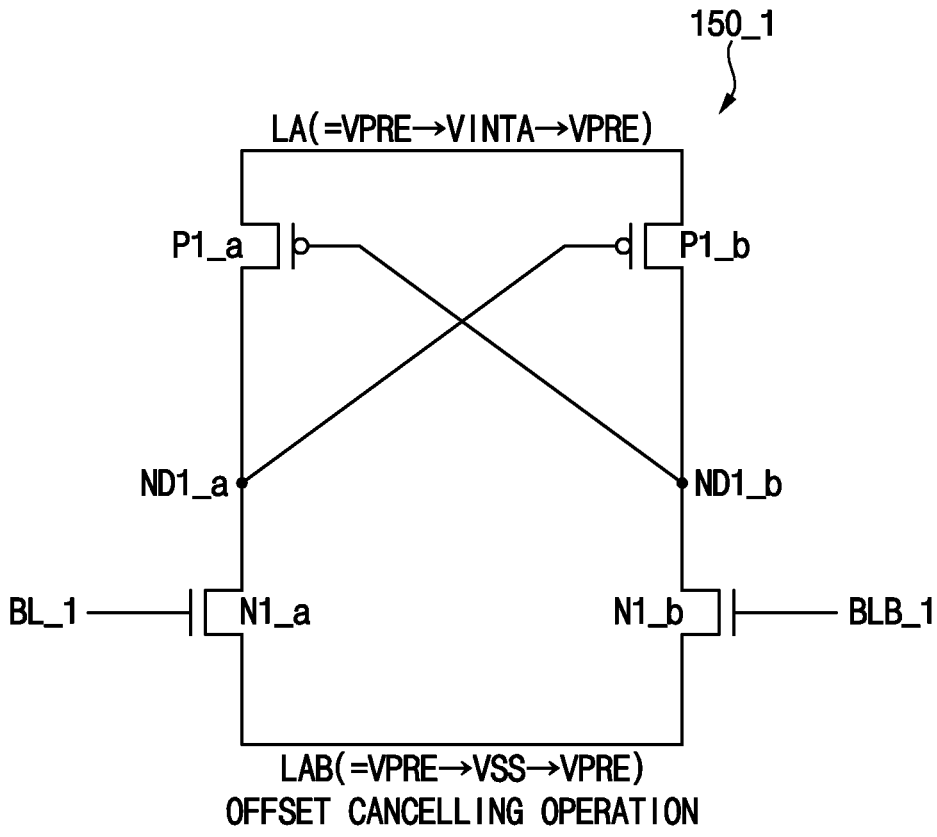

Referring to FIG. 7, the bitline BL_1 may be connected to a first node ND1_a and a gate of a second transistor P1_b, and the complementary bitline BLB_1 may be connected to a second node ND1_b and a gate of a first transistor P1_a. Consequently, the voltage of the first control line LA may shift from the precharge voltage VPRE to a power supply voltage VINTA, and the voltage of the second control line LAB may shift from the precharge voltage VPRE to a ground voltage VSS. Thereafter, the voltage of the first control line LA may shift from the power supply voltage VINTA to the precharge voltage VPRE, and the voltage of the second control line LAB may shift from the ground voltage VSS to the precharge voltage VPRE. An offset may be cancelled by the above operation.

Figure 8:
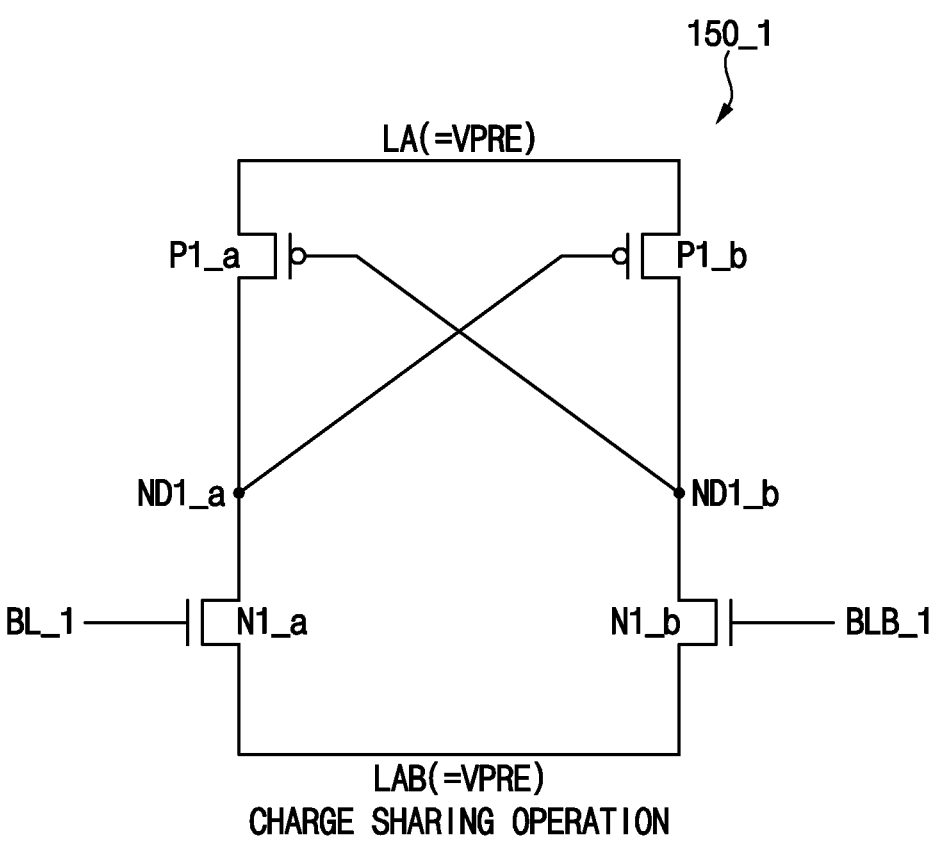

Referring to FIG. 8, a first node ND1_a and a gate of a second transistor P1_b may be connected to each other, and a second node ND1_b and a gate of a first transistor P1_a may be connected to each other. Consequently, a wordline WL connected to the memory cell may be activated, and a charge sharing may occur between charge stored in the cell capacitor of the memory cell and charge stored in the bitline BL_1.

Figure 9:
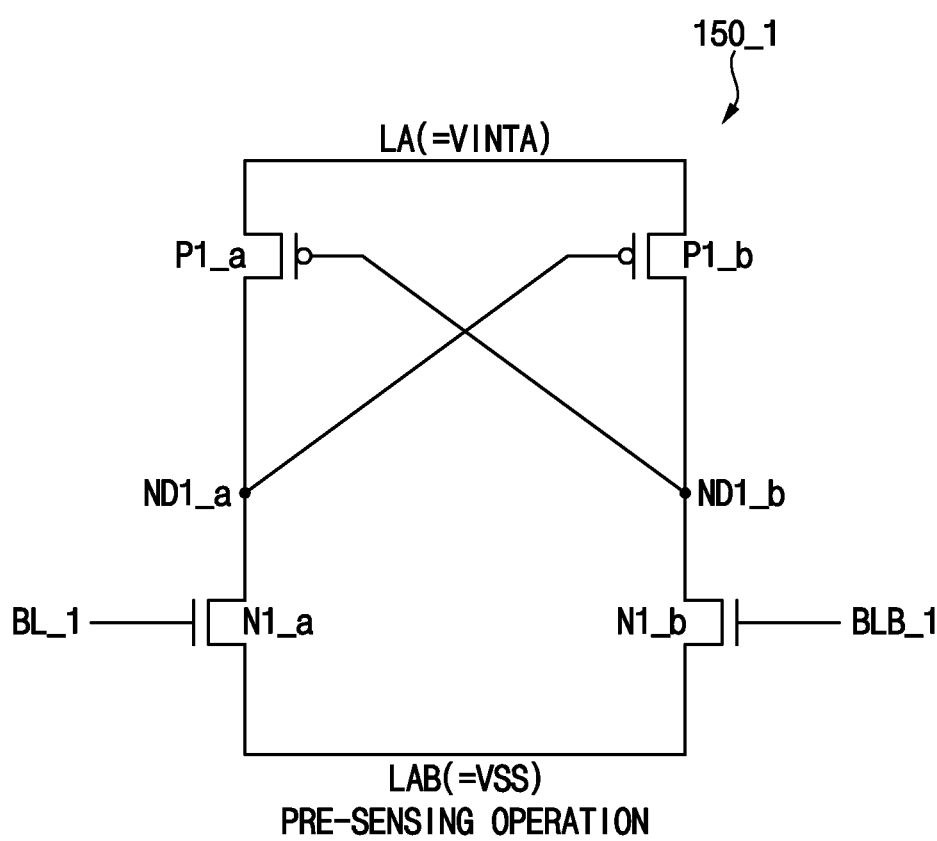

Referring to FIG. 9, a first bitline sense amplifier 150_1 may perform a sensing operation and a restoring operation. For example, when data of '1' (e.g., one, 'high') is stored in the memory cell, the voltage of the bitline BL may increase to the power supply voltage VINTA and the voltage of the complementary bitline BLB may decrease to the ground voltage VSS. Conversely, when data of '0' (e.g., zero, 'low') is stored in the memory cell MC, the voltage of the bitline BL may decrease to the ground voltage VSS and the voltage of the complementary bitline BLB may increase to the power supply voltage VINTA. A voltage difference sensed and amplified by the first bitline sense amplifier 150_1 may develop the voltages of the bitline BL_1 and the complementary bitline BLB_1 to the power supply voltage VINTA or the ground voltage VSS. After the sensing operation is performed, the restoring operation may be performed to store the data in the memory cell based on the developed voltages. Alternatively or additionally, the bitline BL_1 and the complementary bitline BLB_1, the voltages of which are developed to the voltage VINTA or the ground voltage VSS, may be connected to the data line and output the data to the data input/output (I/O) circuit (e.g., a data I/O circuit 160 of FIG. 11) via the data line.

Figure 10:
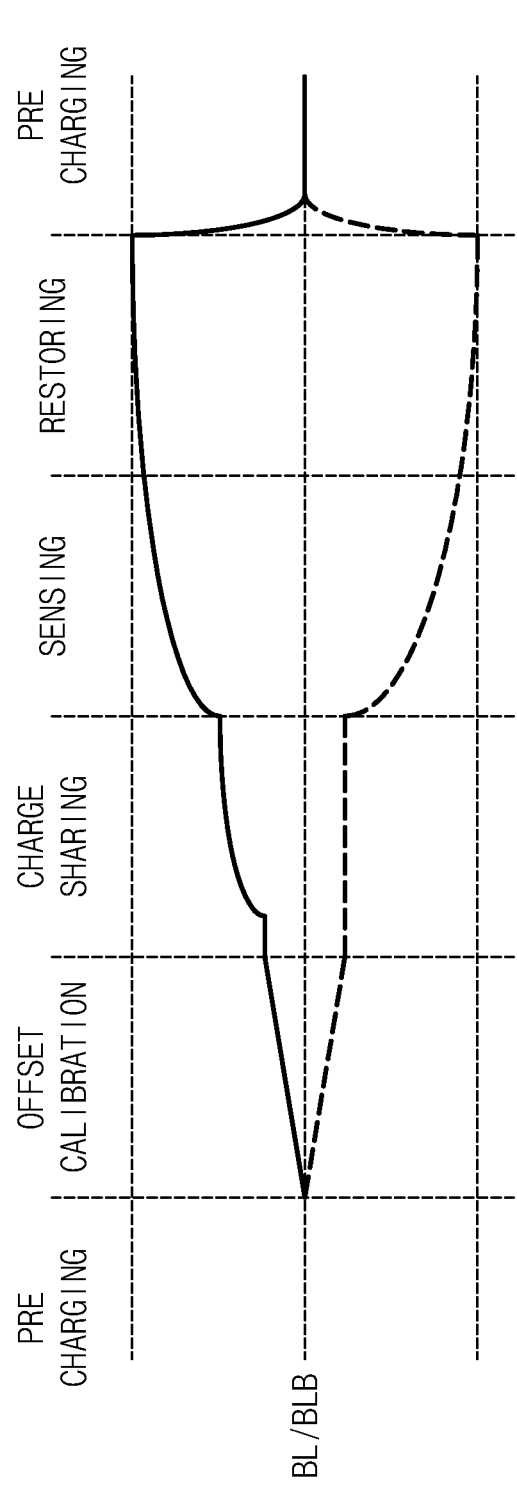

Referring to FIG. 10, as described above with reference to FIGS. 6 to 9, the first bitline sense amplifier 150_1 may perform a precharge operation, an offset cancellation operation, a charge sharing operation, a sensing and restoring operation, and a precharge operation in sequence, and may sense and output data stored in the memory cell.

Figure 11:
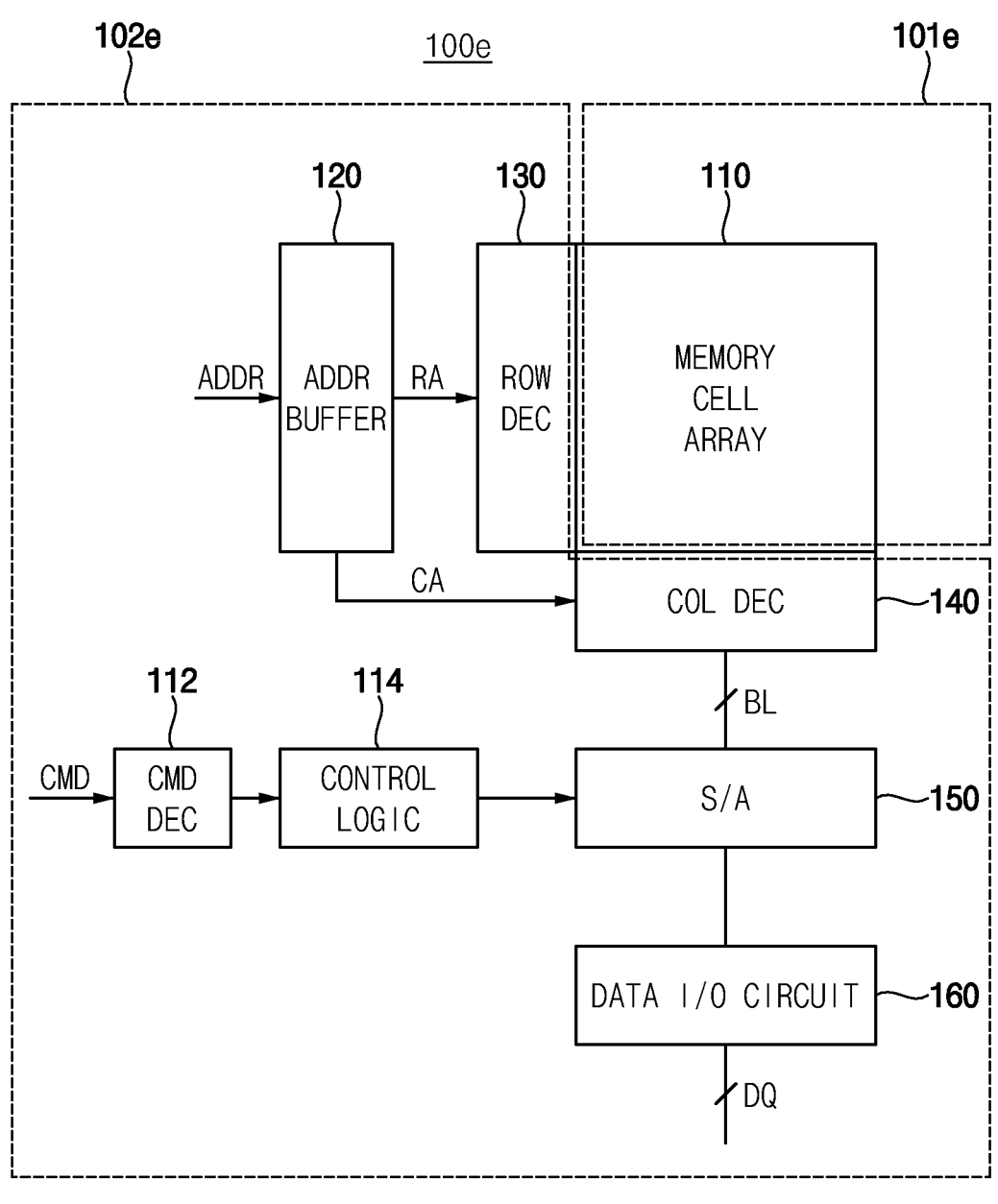
FIG. 11 is a block diagram schematically illustrating a memory package in two dimensions, according to example embodiments.

FIG. 11 is a block diagram schematically illustrating a memory package according to example embodiments in two dimensions.

Referring to FIG. 11, a memory device 100e, a first semiconductor layer 101e, and a second semiconductor layer 102e may be an example of a memory device 100, a first semiconductor layer 101, and a second semiconductor layer 102 in FIG. 1. The memory device 100e may output data via data lines DQ in response to a command CMD, an address ADDR, and control signals that are received from an external device (e.g., a memory controller).

The memory device 100e may include a memory cell array 110, an address buffer 120, a row decoder 130, a column decoder 140, a command decoder 112, a control logic 114, a bitline sense amplifier module (S/A) 150, and a data I/O circuit 160.

For example, the memory cell array 110 may be on the first semiconductor layer 101e. As another example, the address buffer 120, the row decoder 130, the column decoder 140, the command decoder 112, the control logic 114, the bitline sense amplifier module 150, and the data input/output circuit 160 may be on the second semiconductor layer 102e.

The memory cell array 110 may include a plurality of memory cells provided in a matrix form arranged in rows and columns. For example, the memory cell array 110 may include a plurality of wordlines and a plurality of bitlines BL connected to the memory cells. For example, the plurality of wordlines may be connected to the rows of the memory cells and the plurality of bitlines BL may be connected to the columns of the memory cells.

The command decoder 112 may decode a write enable signal WE, a row address strobe signal RAS, a column address strobe signal CAS, a chip select signal CS, and the like, which may be received from the external device (e.g., the memory controller) so that control signals corresponding to the command CMD may be generated by the control logic 114. For example, the command CMD may include, but not be limited to, an active command, a read command, a write command, a precharge command, and the like.

The address buffer 120 may receive the address ADDR from the external device (e.g., the memory controller). The address ADDR may include a row address RA to address the row of the memory cell array 110 and/or a column address CA to address the column of the memory cell array 110. The address buffer 120 may send the row address RA to the row decoder 130 and the column address CA to the column decoder 140.

The row decoder 130 may select any one of the plurality of wordlines connected to the memory cell array 110. The row decoder 130 may decode the row address RA received from the address buffer 120, select any one wordline corresponding to the row address RA, and activate the selected wordline.

The column decoder 140 may select a certain bitline BL from among the plurality of bitlines BL of the memory cell array 110. The column decoder 140 may decode the column address CA received from the address buffer 120 and select the certain bitline BL corresponding to the column address CA.

The bitline sense amplifier module 150 may include a plurality of bitline sense amplifiers respectively connected to the plurality of bitlines BL of the memory cell array 110. For example, the plurality of bitline sense amplifiers may include the first bitline sense amplifier 150_1 described with reference to FIG. 3. As another example, the plurality of bitline sense amplifiers may sense voltage changes in the plurality of bitlines BL, may amplify the voltage changes, and may output the amplified voltage changes.

A first bitline sense amplifier included in the plurality of bitline sense amplifiers may be connected to one bitline and one complementary bitline, and may control sensing and amplifying operations via a first control line and a second control line. For example, the first control line may be connected to a power supply terminal of the memory device 100e to selectively supply a power supply voltage to a certain node of the first bitline sense amplifier, and the second control line may be connected to a ground terminal of the memory device 100e to ground a certain node of the first bitline sense amplifier. The first control line may be connected to a first node of the first bitline sense amplifier and the second control line may be connected to a second node of the first bitline sense amplifier.

The data I/O circuit 160 may output to the outside, via the data lines DQ, data generated based on a voltage that is sensed and amplified by the first bitline sense amplifier module 150.

FIG. 12 is a diagram of a bitline voltage sensing operation of a first bitline sense amplifier included in a memory device, according to example embodiments.

Referring to FIG. 12, a bitline sense amplifier module 150 may be connected to a first memory cell array block 110a. For example, in a memory device having a COP structure, the first memory cell array block 110a and the bitline sense amplifier module 150 may be located in different semiconductor layers. For example, the first memory cell array block 110a may be connected to a plurality of bitlines (e.g., first bitline BL_1, second bitline BL_2, to n-th bitline BL_n, where n is a positive integer greater than two (2)) and to a plurality of complementary bitlines (e.g., first complementary bitline BLB_1, second complementary bitline BLB_2, to n-th complementary bitline BLB_n).

The bitline sense amplifier module 150 may include a plurality of bitline sense amplifiers (e.g., first bitline sense amplifier 150_1, second bitline sense amplifier 150_2, to n-th bitline sense amplifier 150_n) respectively connected to the plurality of bitlines BL_1 to BL_n and respectively connected to the plurality of complementary bitlines BLB_1 to BLB_n. For example, the first bitline sense amplifier 150_1 may be connected to a first bitline BL_1 and a first complementary bitline BLB_1, and may perform an operation of sensing and amplifying a voltage of the first bitline BL_1. As another example, the plurality of bitline sense amplifiers 150_1 to 150_n may be connected to a first control line LA and a second control line LAB, and may control the sensing and amplifying operations via the first control line LA and the second control line LAB. Each bitline sense amplifier of the plurality of bitline sense amplifiers 150_1 to 150_n may be substantially similar and/or the same as the first bitline sense amplifier 150_1 described with reference to FIG. 3.

FIG. 13 is a block diagram illustrating a memory system, according to example embodiments.

Referring to FIG. 13, a memory system 1000 may include a memory controller 1200 and a memory module 1400. The memory module 1400 may include one or more memory devices 1800, each of which may include the memory cell array, and a buffer device 1600 to route signals transceived between the memory devices 1800 and the memory controller 1200 or to manage memory operations of the memory devices 1800. For example, the memory devices 1800 and the buffer device 1600 may represent memory chips and a buffer chip, respectively.

The memory devices 1800 of the memory module 1400 may be divided into a first rank R1 and a second rank R2. For example, each of the memory devices 1800 may a have structure of the memory device 100 described with reference to FIG. 1. As another example, each of the memory devices 1800 may include a plurality of bitline sense amplifiers to which the layout structure of the first bitline sense amplifier described with reference to FIGS. 4A to 4D may be applied.

As shown in FIG. 13, an example is illustrated in which some of functions of the memory controller 1200 may be performed in the memory module 1400 of a load reduced dual in-line memory module (DIMM) (LRDIMM) type. However, the present disclosure is not limited thereto. For example, when the memory module 1400 of a fully buffered DIMM (FBDIMM) type is applied, an advanced memory buffer (AMB) chip may be mounted on the memory module 1400 as a buffer chip. In addition, the memory module 1400 of another type may be applied, and the memory module 1400 may be implemented such that at least some of the functions of the memory controller 1200 described above may be performed in the memory module 1400.

Figure 14A:
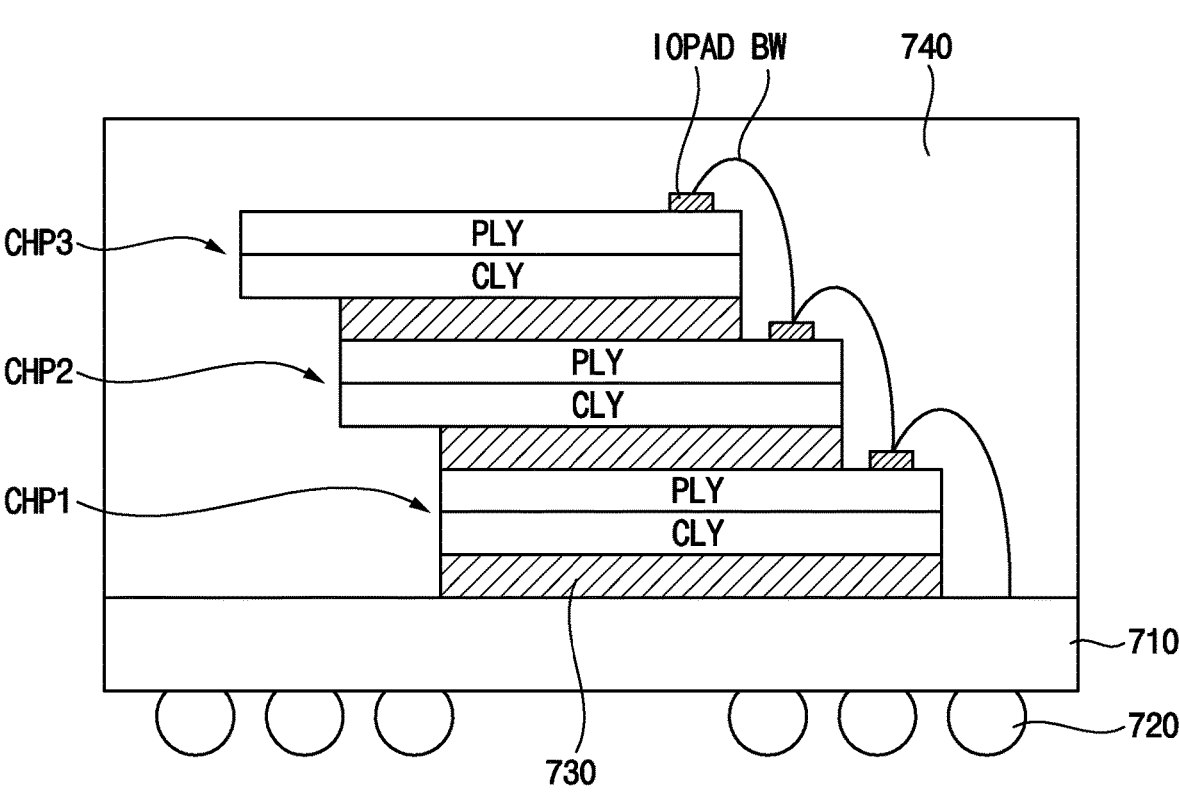
FIGS. 14A and 14B are cross-sectional views of a memory package, according to example embodiments.
Figure 14B:
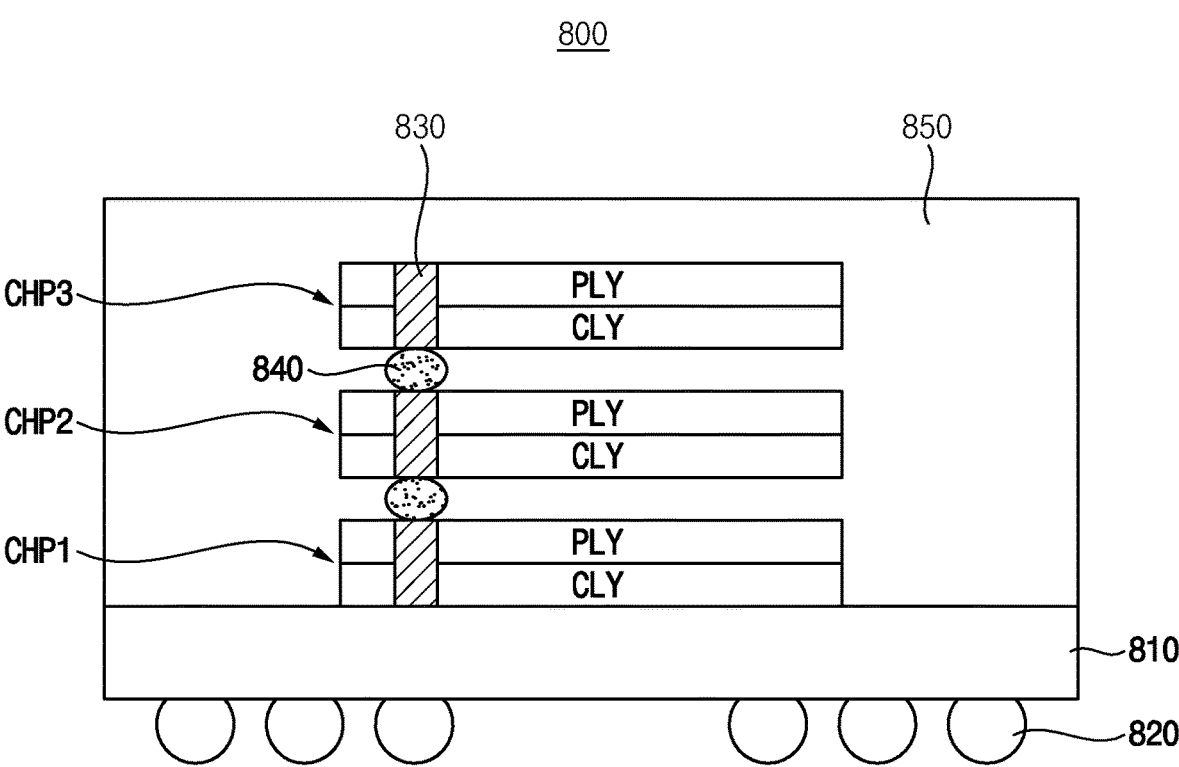

FIGS. 14A and 14B are cross-sectional views of a memory package, according to example embodiments.

Referring to FIG. 14A, a memory package 700 may include a base substrate 710 and a plurality of memory chips (e.g., a first memory chip CHP1, a second memory chip CHP2, and a third memory chip CHP3) stacked on the base substrate 710.

Each of the plurality of memory chips CHP1 to CHP3 may include a memory cell layer CLY and a peripheral circuit layer PLY, and may further include a plurality of I/O pads IOPAD. The memory cell layer CLY and the peripheral circuit layer PLY may correspond to the first semiconductor layer 101 and the second semiconductor layer 102 described with reference to FIG. 1, respectively, and further may include said elements described herein to be included in the first semiconductor layer 101 and the second semiconductor layer 102, respectively, according to any of the example embodiments described herein. Each of the plurality of memory chips CHP1 to CHP3 may include a memory device according to example embodiments.

In some example embodiments, the plurality of memory chips CHP1 to CHP3 may be stacked on the base substrate 710 such that a surface on which the plurality of I/O pads IOPAD are formed faces upwards. In some example embodiments, with respect to each of the plurality of memory chips CHP1 to CHP3, the plurality of I/O pads IOPAD may be arranged near one side of the semiconductor substrate. As such, the plurality of memory chips CHP1 to CHP3 may be stacked scalariformly (e.g., in a step shape), such that the plurality of I/O pads IOPAD of each memory chip may be exposed. In such a stacked state, the plurality of memory chips CHP1 to CHP3 may be electrically connected to the base substrate 710 through a plurality of bonding wires BW.

The plurality of stacked memory chips CHP1 to CHP3 and the plurality of bonding wires BW may be fixed by a sealing member 740, and adhesive members 730 may intervene between the base substrate 710 and the plurality of memory chips CHP1 to CHP3. Conductive bumps 720 may be formed on a bottom surface of the base substrate 710 for electrical connections to an external device.

Referring to FIG. 14B, a memory package 800 may include a base substrate 810 and the plurality of memory chips CHP1 to CHP3 stacked on the base substrate 810. The descriptions repeated with FIG. 14A will be omitted. The memory package 800 may include and/or may be similar in many respects to the memory package 700 described above with reference to FIG. 14A, and may include additional features not mentioned above. Consequently, repeated descriptions of the memory package 800 described above with reference to FIG. 14A may be omitted for the sake of brevity.

Each of the plurality of memory chips CHP1 to CHP3 may include the memory cell layer CLY and the peripheral circuit layer PLY, and may further include a plurality of through silicon vias (TSVs) 830.

In some example embodiments, with respect to each of plurality of the memory chips CHP1 to CHP3, the plurality of TSVs 830 may be arranged at the same locations in each memory chip. As such, the plurality of memory chips CHP1 to CHP3 may be stacked such that the plurality of TSVs 830 of each memory chip may be substantially and/or completely overlapped (e.g., arrangements of the plurality of TSVs 830 may be perfectly matched in the plurality of memory chips CHP1 to CHP3). In such a stacked state, the plurality of memory chips CHP1 to CHP3 may be electrically connected to one another and the base substrate 810 through the plurality of TSVs 830 and conductive material 840.

Conductive bumps 820 and a sealing member 850 may be substantially similar and/or the same as the conductive bumps 720 and the sealing member 740 described with reference to FIG. 14A.

Figure 15:
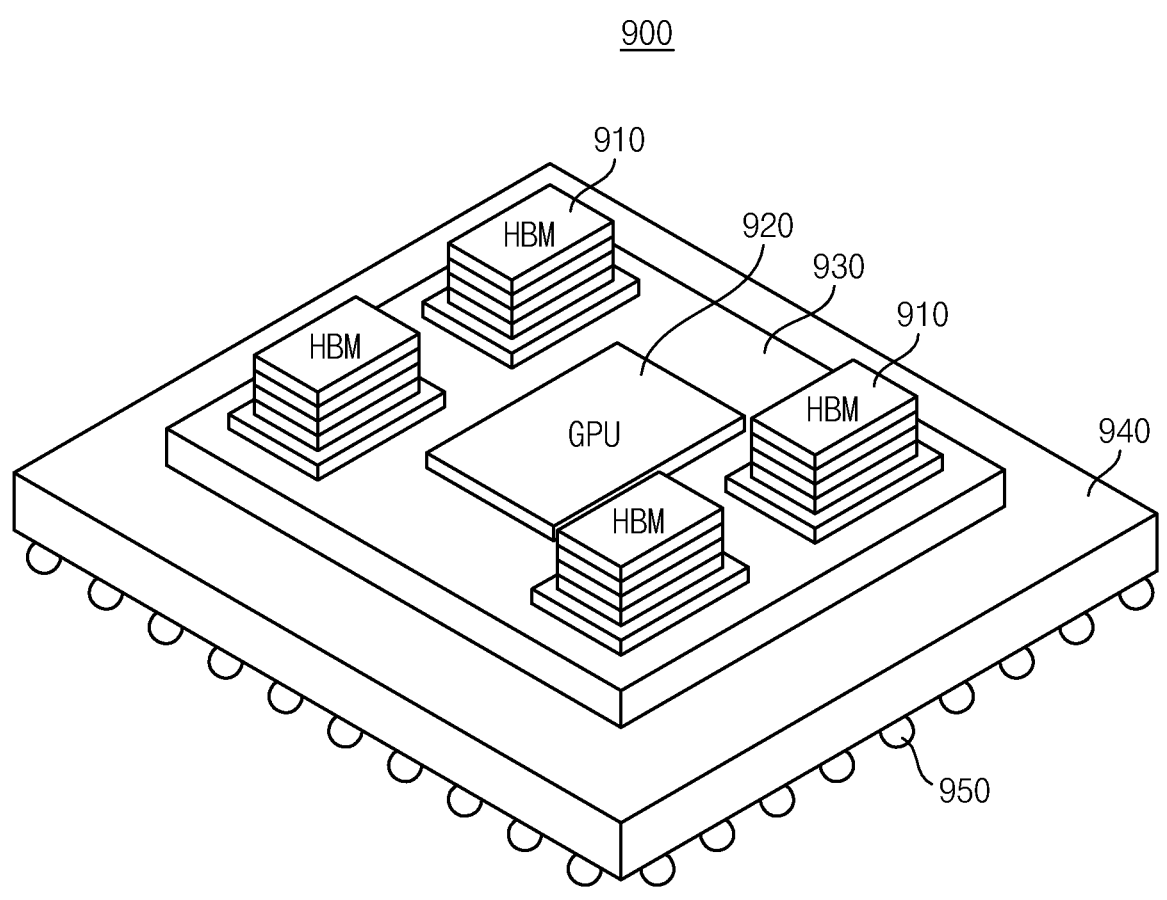
FIG. 15 is a diagram illustrating a memory package including a memory device, according to example embodiments.

FIG. 15 is a diagram illustrating a memory package including a memory device, according to example embodiments.

Referring to FIG. 15, a semiconductor package 900 may include one or more stacked memory devices 910 and a processing device 920. For example, the processing device 920 may be a graphic processing unit (GPU).

The stacked memory devices 910 and the processing device 920 may be mounted on an interposer 930, and the interposer 930 on which the stacked memory devices 910 and the processing device 920 are mounted may be mounted on a package substrate 940 mounted on solder balls 950. The processing device 920 may correspond to a semiconductor device which may perform a memory control function, and for example, the processing device 920 may be implemented as an application processor (AP) or one of various processors.

The stacked memory devices 910 may be implemented in various forms, and the stacked memory devices 910 may be and/or may include a memory device in a high bandwidth memory (HBM) form in which a plurality of layers may be stacked. Accordingly, the stacked memory devices 910 may be implemented by stacking the plurality of memory chips including the memory devices according to example embodiments, as described with reference to FIGS. 14A and 14B.

The plurality of stacked memory devices 910 may be mounted on the interposer 930, and the processing device 920 may communicate with the plurality of stacked memory devices 910. For example, each of the stacked memory devices 910 and the processing device 920 may include a physical region, and communication may be performed between the stacked memory devices 910 and the processing device 920 through the physical regions. For example, when the stacked memory devices 910 include a direct access region, a signal may be provided into the stacked memory devices 910 through conductive means (e.g., the solder balls 950) mounted under the package substrate 940 and the direct access region.

The example embodiments may be applied to various electronic devices and systems that may include memory devices and memory systems. For example, the example embodiments may be applied to systems such as, but not limited to, a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, and the like.

The foregoing is illustrative of example embodiments and is not to be construed as limiting thereof. Although some example embodiments have been described, those skilled in the art will readily appreciate that many modifications may be possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory device, comprising:
   a first semiconductor layer comprising:
      a memory cell array;
      a first bitline and a first complementary bitline extending in a first direction, disposed along a second direction crossing the first direction, and coupled with the memory cell array;
      a first vertical wire and a first bonding pad coupled with the first bitline; and
      a second vertical wire and a second bonding pad coupled with the first complementary bitline;
   a second semiconductor layer disposed with respect to the first semiconductor layer in a third direction perpendicular to the first direction and the second direction, the second semiconductor layer comprising:

a peripheral circuit configured to control the memory cell array;

a first bitline sense amplifier configured to control the first bitline and the first complementary bitline;

a first control line and a second control line coupled with the first bitline sense amplifier;

a third bonding pad and a third vertical wire coupled with the first bonding pad and the first bitline sense amplifier; and a fourth bonding pad and a fourth vertical wire coupled with the second bonding pad and the first bitline sense amplifier, wherein the first bitline sense amplifier comprises a first pair of P-channel transistors and a first pair of N-channel transistors, wherein P-channel transistors of the first pair of P-channel transistors are physically disposed along the second direction, wherein N-channel transistors of the first pair of N-channel transistors are physically disposed along the second direction, wherein the first pair of P-channel transistors and the first pair of N-channel transistors are physically disposed along the first direction, and wherein the first control line is physically shared by the P-channel transistors of the first pair of P-channel transistors and the second control line is physically shared by the N-channel transistors of the first pair of N-channel transistors.

2. The memory device of claim 1, wherein the first bitline sense amplifier further comprises a first node coupled with the first pair of P-channel transistors, and wherein the first control line is coupled with the first node.

3. The memory device of claim 2, wherein the first control line is coupled with a power supply voltage terminal of the memory device.

4. The memory device of claim 1, wherein the first bitline sense amplifier further comprises a second node coupled with the first pair of N-channel transistors, and wherein the second control line is coupled with the second node.

5. The memory device of claim 4, wherein the second control line is coupled with a ground terminal of the memory device.

6. The memory device of claim 1, wherein the first semiconductor layer further comprises:

a second bitline and a second complementary bitline extending in the first direction, disposed along the second direction crossing the first direction, and coupled with the memory cell array;

a fifth vertical wire and a fifth bonding pad coupled with the second bitline; and a sixth vertical wire and a sixth bonding pad coupled with the second complementary bitline, wherein the second semiconductor layer further comprises:

a second bitline sense amplifier configured to control the second bitline and the second complementary bitline;

a third control line and a fourth control line coupled with the second bitline sense amplifier;

a seventh bonding pad and a seventh vertical wire coupled with the fifth bonding pad and the second bitline sense amplifier; and an eighth bonding pad and an eighth vertical wire coupled with the sixth bonding pad and the second bitline sense amplifier, and wherein the second bitline sense amplifier comprises at least one second transistor pair that is shared by at least one of the third control line and the fourth control line.

7. The memory device of claim 6, wherein the at least one second transistor pair comprises a second pair of P-channel transistors and a second pair of N-channel transistors.

8. The memory device of claim 7, wherein the second bitline sense amplifier further comprises a third node coupled with the second pair of P-channel transistors, and wherein the third control line is coupled with the third node.

9. The memory device of claim 7, wherein the second bitline sense amplifier further comprises a fourth node coupled with the second pair of N-channel transistors, and wherein the fourth control line is coupled with the fourth node.

10. The memory device of claim 6, wherein the second bitline sense amplifier is adjacent to the first bitline sense amplifier in the first direction.

11. The memory device of claim 1, further comprising:

a third semiconductor layer disposed with respect to the second semiconductor layer in the third direction, wherein the third semiconductor layer comprises:

a second bitline and a second complementary bitline extending in the first direction and disposed along the second direction;

a second memory cell array coupled with the second bitline and the second complementary bitline;

a fifth vertical wire and a fifth bonding pad coupled with the second bitline; and a sixth vertical wire and a sixth bonding pad coupled with the second complementary bitline, wherein the second semiconductor layer further comprises:

a second bitline sense amplifier configured to control the second bitline and the second complementary bitline;

a third control line and a fourth control line coupled with the second bitline sense amplifier;

a seventh bonding pad and a seventh vertical wire coupled with the fifth bonding pad and the second bitline sense amplifier; and an eighth bonding pad and an eighth vertical wire coupled with the sixth bonding pad and the second bitline sense amplifier, and wherein the second bitline sense amplifier comprises at least one second transistor pair that is shared by at least one of the third control line and the fourth control line.

12. The memory device of claim 1, further comprising:

a third semiconductor layer disposed with respect to the first semiconductor layer in the third direction, wherein the third semiconductor layer comprises:

a second peripheral circuit configured to control a second memory cell array; a second bitline sense amplifier configured to control a second bitline and a second complementary bitline;

a third control line and a fourth control line coupled with the second bitline sense amplifier;

a seventh bonding pad and a seventh vertical wire coupled with a fifth bonding pad and the second bitline sense amplifier; and an eighth bonding pad and an eighth vertical wire coupled with a sixth bonding pad and the second bitline sense amplifier, and wherein the first semiconductor layer further comprises:

the second bitline and the second complementary bitline extending in the first direction, disposed along the second direction crossing the first direction and coupled with the memory cell array;

a fifth vertical wire and the fifth bonding pad coupled with the second bitline; and a sixth vertical wire and the sixth bonding pad coupled with the second complementary bitline, and wherein the second bitline sense amplifier comprises at least one second transistor pair that is shared by at least one of the third control line and the fourth control line.

13. The memory device of claim 1, wherein the memory device comprises a dynamic random access memory (DRAM).

14. The memory device of claim 1, wherein the first semiconductor layer and the second semiconductor layer are electrically coupled in the third direction by the first bonding pad, the second bonding pad, the third bonding pad, and the fourth bonding pad.

15. A memory system, comprising:

a memory device; and a memory controller configured to control operations of the memory device, wherein the memory device comprises:

a first semiconductor layer comprising:

a memory cell array;

a first bitline and a first complementary bitline extending in a first direction, disposed along a second direction crossing the first direction, and coupled with the memory cell array;

a first vertical wire and a first bonding pad coupled with the first bitline; and a second vertical wire and a second bonding pad coupled with the first complementary bitline;

a second semiconductor layer disposed with respect to the first semiconductor layer in a third direction perpendicular to the first direction and the second direction, the second semiconductor layer comprising:

a peripheral circuit configured to control the memory cell array;

a first bitline sense amplifier configured to control the first bitline and the first complementary bitline;

a first control line and a second control line coupled with the first bitline sense amplifier;

a third bonding pad and a third vertical wire coupled with the first bonding pad and the first bitline sense amplifier; and a fourth bonding pad and a fourth vertical wire coupled with the second bonding pad and the first bitline sense amplifier, wherein the first bitline sense amplifier comprises a first pair of P-channel transistors and a first pair of N-channel transistors, wherein P-channel transistors of the first pair of P-channel transistors are physically disposed along the second direction, wherein N-channel transistors of the first pair of N-channel transistors are physically disposed along the second direction, wherein the first pair of P-channel transistors and the first pair of N-channel transistors are physically disposed along the first direction, and wherein the first control line is physically shared by the P-channel transistors of the first pair of P-channel transistors and the second control line is physically shared by the N-channel transistors of the first pair of N-channel transistors.

16. The memory system of claim 15, further comprising:

a buffer device configured to:

route signals between the memory device and the memory controller; and manage operations of the memory device.

17. A memory device, comprising:

a first semiconductor layer comprising:

a memory cell array;

a first bitline and a first complementary bitline extending in a first direction, disposed along a second direction crossing the first direction, and coupled with the memory cell array;

a first vertical wire and a first bonding pad coupled with the first bitline; and a second vertical wire and a second bonding pad coupled with the first complementary bitline;

a second semiconductor layer disposed with respect to the first semiconductor layer in a third direction perpendicular to the first direction and the second direction, the second semiconductor layer comprising:

a peripheral circuit configured to control the memory cell array;

a first bitline sense amplifier configured to control the first bitline and the first complementary bitline;

a first control line and a second control line coupled with the first bitline sense amplifier;

a third bonding pad and a third vertical wire coupled with the first bonding pad and the first bitline sense amplifier; and a fourth bonding pad and a fourth vertical wire coupled with the second bonding pad and the first bitline sense amplifier, wherein the first bitline sense amplifier comprises a first pair of P-channel transistors, a first pair of N-channel transistors, a first node coupled with the first pair of P-channel transistors, and a second node coupled with the first pair of N-channel transistors, wherein P-channel transistors of the first pair of P-channel transistors are physically disposed along the second direction, wherein N-channel transistors of the first pair of N-channel transistors are physically disposed along the second direction, wherein the first pair of P-channel transistors and the first pair of N-channel transistors are physically disposed along the first direction, wherein the first control line is coupled with the first node and is physically shared by the P-channel transistors of the first pair of P-channel transistors, and wherein the second control line is coupled with the second node and is physically shared by the N-channel transistors of the first pair of N-channel transistors.

* * * * *